United States Patent

Ooishi et al.

[11] Patent Number: 5,828,258
[45] Date of Patent: Oct. 27, 1998

[54] SEMICONDUCTOR DEVICE AND TESTING APPARATUS THEREOF

[75] Inventors: Tsukasa Ooishi; Tomoya Kawagoe; Hideto Hidaka; Mikio Asakura, all of Hyogo, Japan

[73] Assignee: Mitsubishi Denki Kabushiki Kaisha, Tokyo, Japan

[21] Appl. No.: 639,326

[22] Filed: Apr. 25, 1996

[30] Foreign Application Priority Data

Jun. 23, 1995 [JP] Japan ..................................... 7-157377
Nov. 28, 1995 [JP] Japan ..................................... 7-309576

[51] Int. Cl.⁶ ........................................................ G06F 1/04
[52] U.S. Cl. ........................ 327/291; 327/276; 327/290; 331/57
[58] Field of Search ............................ 327/276–283, 327/290, 291; 331/57

[56] References Cited

U.S. PATENT DOCUMENTS

| | | | |
|---|---|---|---|
| 4,821,003 | 4/1989 | Kameya | 327/283 |
| 4,894,791 | 1/1990 | Jiang et al. | 327/276 |
| 5,012,142 | 4/1991 | Sonntag | 327/281 |
| 5,051,630 | 9/1991 | Kogan et al. | 327/285 |
| 5,229,667 | 7/1993 | Shimizu | 327/281 |
| 5,352,945 | 10/1994 | Casper et al. | 331/57 |
| 5,416,436 | 5/1995 | Rainard | 327/278 |

OTHER PUBLICATIONS

"A 4–Mb Psuedo SRAM Operationg at 2.6±1 V with 3–$\mu$A Data Retention Current" Katusuki Sato et al. IEEE Journal of Solid–State Circuits, vol. 26, No. 11 Nov. 1991.

Elektronik Sonderheft III, Mikroprozessoren, Franzis–Verlag BmgH, Munchen, 1979, pp. 43–49.

Halbleiterschaltungstechnik von U. Tietze, Ch. Schenk, Springerverlag, Berlin, 10th Ed., 1993, Chapter 15.2.2.

Primary Examiner—Timothy P. Callahan
Assistant Examiner—Jeffrey Zweizig
Attorney, Agent, or Firm—McDermott, Will & Emery

[57] ABSTRACT

A tester is connected to a signal output terminal provided in a DRAM chip, and a frequency of a clock signal output from an internal timer is monitored. The frequency of the clock signal is varied by changing the combination of 3 bit signals, so as to obtain signals by which the frequency closest to the set value is obtained. A fuse in the internal timer is disconnected to set the frequency of the clock signal so as to obtain the same state as in the case where that signal is applied.

11 Claims, 29 Drawing Sheets

SEMICONDUCTOR DEVICE AND TESTING APPARATUS THEREOF

BACKGROUND OF THE INVENTION

1. Field of the Invention

The present invention relates to a semiconductor device and a testing apparatus thereof. More particularly, the present invention relates to a semiconductor device which performs a prescribed operation in synchronization with a clock signal and a testing apparatus thereof.

2. Description of the Background Art

FIG. 29 is a circuit block diagram showing a structure of a conventional dynamic random access memory (hereinafter referred to as DRAM) chip. Referring to FIG. 29, this DRAM chip includes a power supply terminal 201, a ground terminal 202, an internal timer 203 and an internal circuit 204. Internal timer 203 and internal circuit 204 both receive a power supply potential Vcc and a ground potential GND externally through power supply terminal 201 and ground terminal 202. Internal timer 203 includes a self-oscillating oscillator such as a ring oscillator, and applies a clock signal φ with a prescribed frequency to internal circuit 204. Internal circuit 204 performs a prescribed operation (for example, refresh operation) in synchronization with that clock signal φ.

In the conventional DRAM chip, however, there has been a problem that the value of the frequency of the clock signal φ would be offset from the originally set value due to inconstancy in manufacturing such that desired operation characteristics cannot be obtained. For example, when the frequency of the clock signal φ becomes unnecessarily high, power dissipation would increase to an unwanted extent or there would be erroneous operation in the system including DRAM because the internal circuit 204 cannot interlock with the external components. However, even a means for drawing the clock signal φ externally to measure its frequency was not provided in the conventional DRAM chip.

SUMMARY OF THE INVENTION

Based on the foregoing, a first object of the present invention is to provide a semiconductor device in which an oscillation frequency of a built-in oscillator can be measured externally.

Also, it is a second object of the present invention to provide a semiconductor device in which a clock signal can be applied thereto externally so as to test the internal circuit.

It is a third object of the present invention to provide a semiconductor device in which an oscillation frequency of a built-in oscillator can be changed and set or controlled.

It is a fourth object of the present invention to provide a testing apparatus for measuring an oscillation frequency of an oscillator in a semiconductor device.

A first semiconductor device according to the present invention provides an output circuit for externally drawing a clock signal output from an oscillator. Accordingly, it is possible to draw externally the clock signal and to measure its frequency.

A second semiconductor device according to the present invention provides a selecting circuit for selecting one clock signal from an external clock signal input externally and an internal clock signal output from an oscillator. Accordingly, it is possible to apply a clock signal externally and test the internal circuit.

In addition, it is preferred that a signal input/output circuit is further provided for applying an internal clock signal to the internal circuit and externally outputting the internal clock signal in response to selection of the internal clock signal by the selecting circuit, and for blocking the input of the internal clock signal to the internal circuit and applying the external clock signal to the internal circuit in response to the selection of the external clock signal by the selecting circuit. Thus, it is also possible to draw externally the internal clock signal to measure its frequency.

A third semiconductor device according to the present invention provides an oscillator in which oscillation frequency can be changed and a setting circuit for changing and setting the oscillation frequency of the oscillator. Accordingly, even when the oscillation frequency of the oscillator is offset from the originally set value, it is possible to set the oscillation frequency of the oscillator to the originally set value.

The, the oscillator preferably includes a plurality of inverters connected in a ring shape and a variable capacitance circuit to which the output node of each inverter is connected. Thus, by changing and setting the capacitance value of variable capacitance circuit, it is possible to change and set the oscillation frequency of oscillator.

A transistor is preferably provided at each inverter of the oscillator so as to prevent a penetrating current. The transistor is connected to at least one of the portion between a power supply node of the inverter and the power supply line and the portion between a ground node of the inverter and the ground line. Its gate is supplied with an intermediate potential between the power supply potential and the ground potential. Thus, power consumption is reduced.

The, the variable capacitance circuit preferably includes a plurality of transfer gates and capacitors connected in series. The setting circuit includes a fuse which is provided corresponding to each transfer gate for fixing that corresponding transfer gate at a conductive state or non-conductive state by being disconnected. Thus, the capacitance value of the variable capacitance circuit can be set easily and without fail.

The, the oscillator preferably includes a plurality of inverters connected in airing shape and first and second transistors for providing drive current to each inverter. Thus, changing and setting the oscillation frequency of the oscillator can be performed by changing and setting the input voltage of the first and second transistors.

The, the setting circuit preferably includes a constant current source, a third transistor connected in series with the constant current source, forming a mirror circuit with one of the first and second transistors, a plurality of fourth transistors connected in parallel with the third transistor, and a signal generating circuit provided corresponding to each of the fourth transistors to render the corresponding fourth transistor conductive or non-conductive in response to an external signal. Thus, it is made possible to change and set the input voltage of the first and second transistors easily.

The, the setting circuit preferably includes a plurality of constant current sources respectively for making a constant current to flow, a third transistor forming a current mirror circuit with one of the first and second transistors, and a fuse provided corresponding to each constant current source to fix the corresponding constant current source at an active state or inactive state. Thus, the input voltage of the first and second transistors can be changed and set easily and without fail.

It, it is preferred that a plurality of signal converting circuits, selecting circuits and internal circuits are further provided. A clock signal output from the oscillator is input to the signal converting circuit of the first stage. Each of the signal converting circuits converts the clock signal input from its preceding stage to have a period which is many times greater than the preceding the period of that clock signal and outputs the converted clock signal to the following stage. The selecting circuit selects either one of the clock signal output from the oscillator and a plurality of clock signals output from a plurality of signal converting circuits. The internal circuit performs a prescribed operation in synchronization with the clock signal selected by the selecting circuit. Thus, the tuning range of oscillation frequency is increased manifold.

The, the selecting circuit preferably includes a plurality of gate circuits provided corresponding to either one of the oscillator and the plurality of signal converting circuits, to which the clock signal output from the corresponding oscillator or the signal converting circuit is input. The selecting circuit further includes and a fuse provided corresponding to each gate circuit to fix the corresponding gate circuit at a conductive state or non-conductive state by being disconnected. Thus, the selecting circuit is easily constructed.

It is preferred that an output circuit is further provided for drawing the clock signal output from the oscillator externally. Thus, it is possible to measure the frequency of the clock signal output externally from the output circuit while changing and setting the oscillation frequency of the oscillator.

A fourth semiconductor device according to the present invention provides an oscillator in which control of oscillation frequency is possible and a sensing circuit for sensing the selected operation mode. The oscillation frequency of the oscillator is controlled according to the sensed result of the sensing circuit. Accordingly, a clock signal with a frequency appropriate for executing the selected operation mode is generated such that each of the operation modes is performed accurately.

A fifth semiconductor device according to the present invention, an oscillator in which control of oscillation frequency is possible, an internal potential generating circuit driven by a clock signal output from the oscillator, and a detecting circuit for detecting the difference between an internal potential and a predetermined target potential. The oscillation frequency of the oscillator is controlled according to the result of detection by the detecting circuit. Accordingly, a stable internal potential can be obtained.

Furthermore, in a first testing apparatus according to the present invention, a comparing circuit outputs first or second signal corresponding to whether the level of the clock signal is lower or higher than the reference level, while a storing circuit successively stores the output of the comparing circuit with a prescribed sampling period. A reading circuit reads out successively the signal stored in the storing circuit, and a detecting circuit detects the changing point where the result of the reading changes from the first signal to the second signal and then detects the period of the clock signal from the number of times of samplings between two changing points. Thus, the oscillation frequency of the oscillator in the semiconductor device can be detected easily.

A second testing apparatus according to the present invention provides a voltage controlled oscillator for outputting an internal clock signal which is in synchronization with a clock signal and an oscillation frequency of the oscillator is detected based upon the operating parameter of the voltage controlled oscillator. Thus, the oscillation frequency of the oscillator in the semiconductor device can be detected easily with a simple structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
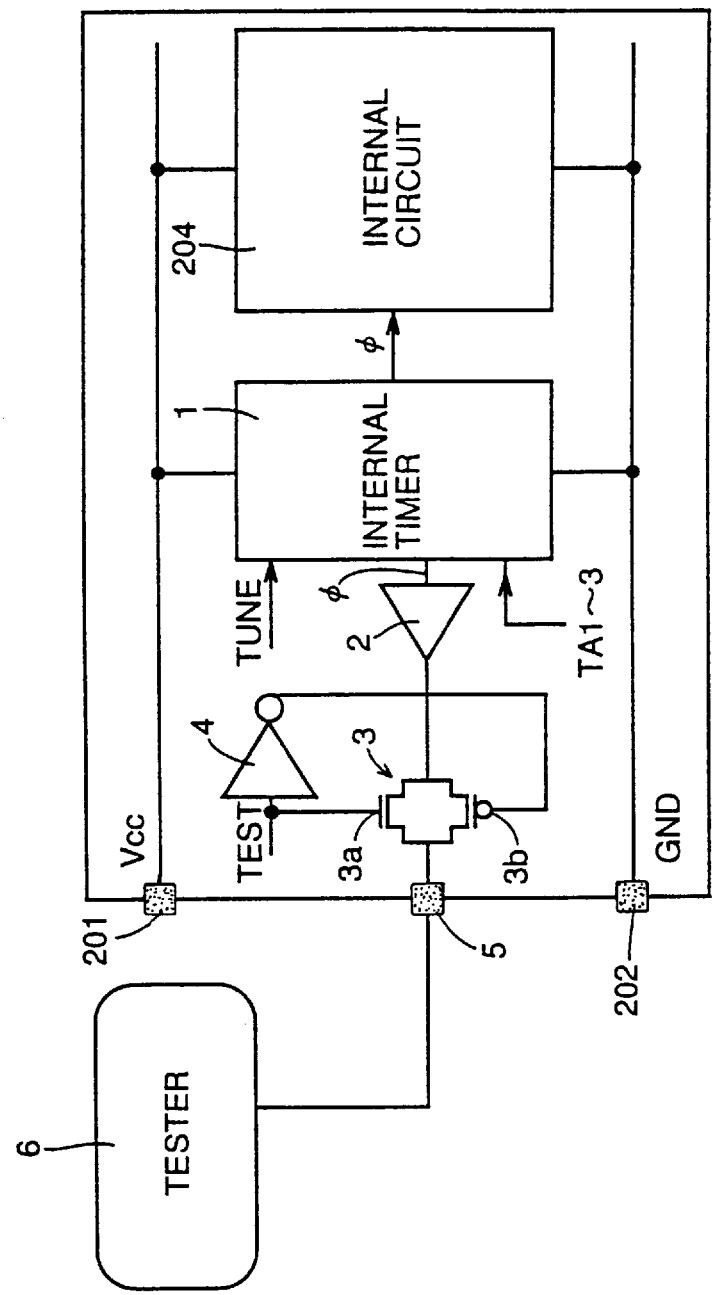
FIG. 1 is a block diagram showing a structure of a DRAM chip according to Embodiment 1 of the present invention.

FIG. 1 is a circuit block diagram showing a DRAM chip according to Embodiment 1 of the present invention and how it is utilized. Referring to FIG. 1, this DRAM chip differs from the DRAM chip shown in FIG. 18 in that the internal timer 203 is replaced by an internal timer 1 and that an amplifier 2, a transfer gate 3, an inverter 4 and a signal outputting terminal 5 are newly provided.

A clock signal $\phi$ output from internal timer 1 is input to an internal circuit 204 as well as to amplifier 2. Transfer gate 3 is connected between an output node of amplifier 2 and signal outputting terminal 5. A test signal TEST is directly input to a gate 3a at the side of N channel MOS transistor of transfer gate 3 as well as to a gate 3b at the side of P channel MOS transistor via inverter 4. A tester 6 is connected to signal outputting terminal 5 for measuring the frequency of clock signal $\phi$ output from internal timer 1.

At the time of testing when the test signal TEST is at "H" level, transfer gate 3 becomes conductive and clock signal $\phi$ output from internal timer 1 is input to tester 6 via amplifier 2, transfer gate 3 and signal outputting terminal 5. When the test is not performed and test signal TEST is at "L" level, transfer gate 3 is non-conductive and clock signal $\phi$ is not output externally.

Figure 2:
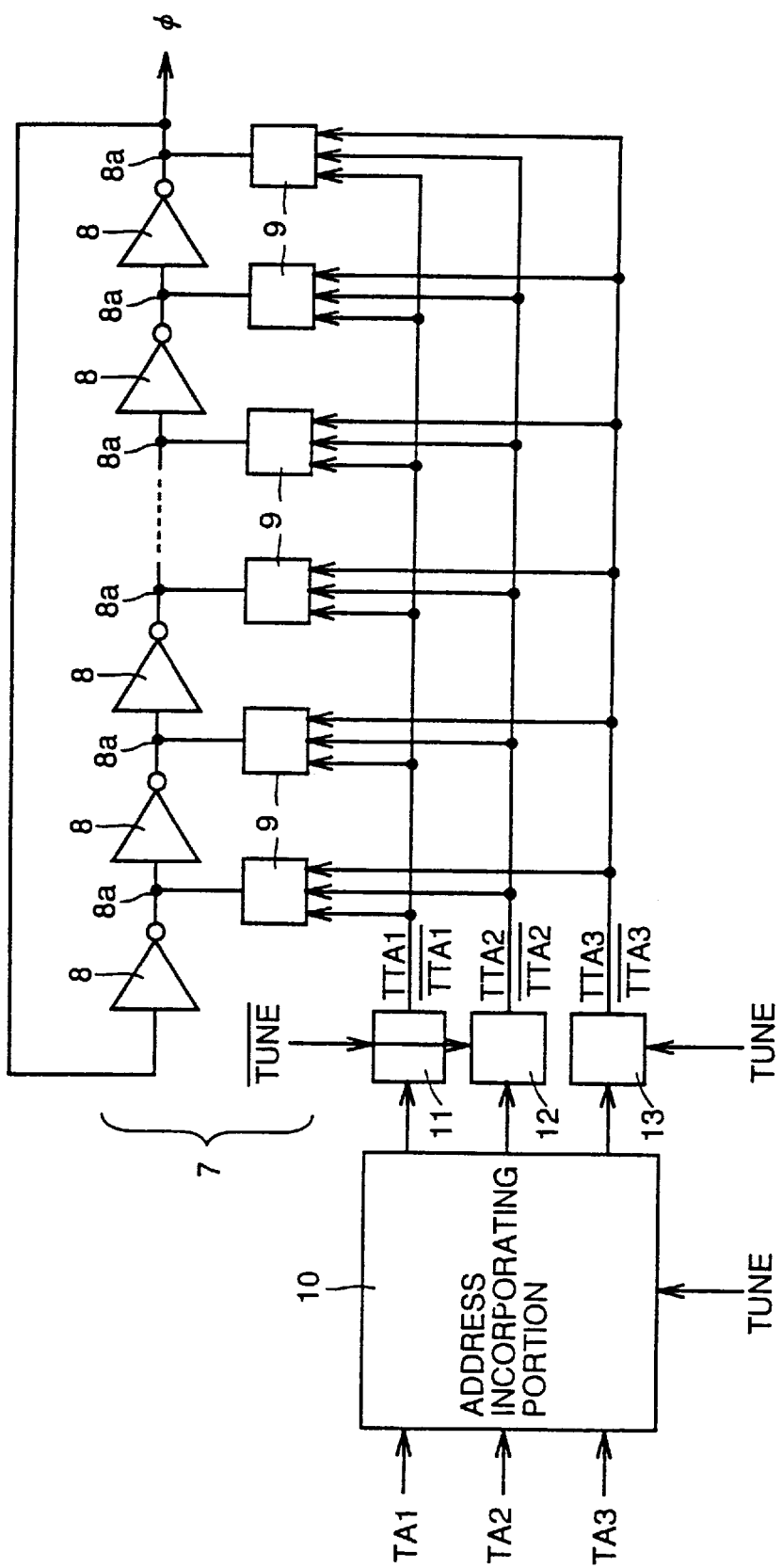
FIG. 2 is a circuit block diagram showing a structure of an internal timer in the DRAM chip shown in FIG. 1.

As shown in FIG. 2, internal timer 1 includes an oscillator 7 in which the oscillation frequency is changeable, and an address incorporating portion 10 as well as tuning control portions 11 to 13 for changing and setting the oscillation frequency of oscillator 7. Oscillator 7 includes odd number of stages of inverters 8 connected in a ring shape and variable capacitance circuits 9 connected to output node 8a of each inverter 8.

Figure 3:
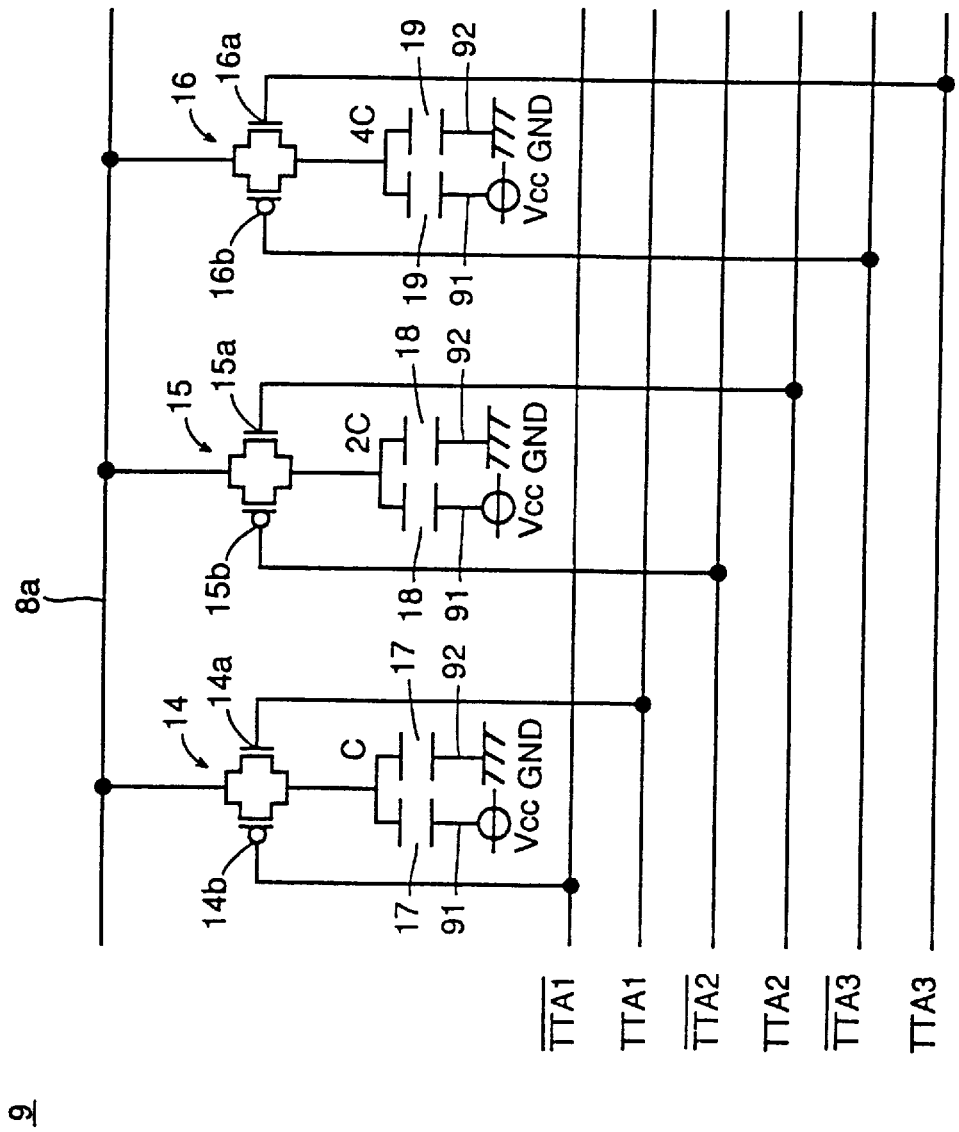
FIG. 3 is a circuit diagram showing a structure of a variable capacitance circuit in the internal timer shown in FIG. 2.

As shown in FIG. 3, variable capacitance circuit 9 includes multiple transfer gates (three transfer gates in the figure) 14 to 16, and multiple pairs (threes pairs in the figure) of capacitors 17, 17; 18, 18; and 19, 19. Ratio of capacitance value of capacitors 17, 18 and 19 is 1:2:4.

One electrode of each transfer gate 14 to 16 is connected to output node 8a of inverter 8 and the other electrode is connected to one electrode of capacitors 17, 17; 18, 18; 19, 19, respectively. The other electrodes of capacitors 17, 17; 18, 18; and 19, 19 are connected respectively to lines 91 of power supply potential Vcc (hereinafter referred to as power supply lines) and to lines 92 of ground potential GND (hereinafter referred to as ground lines). Gate 14a at the side of N channel MOS transistor and gate 14b at the side of P channel MOS transistor in transfer gate 14 receive output signals TTA1, $\overline{TTA1}$ of tuning control portion 11, respectively. Gate 15a at the side of N channel MOS transistor and gate 15b at the side of P channel MOS transistor in transfer gate 15 receive output signals TTA2, $\overline{TTA2}$ of tuning control portion 12, respectively. Gate 16a at the side of N channel MOS transistor and gate 16b at the side of P channel MOS transistor in transfer gate 16 receive output signals TTA3, $\overline{TTA3}$ of tuning control portion 13, respectively.

Since ratio of capacitance value of capacitors 17, 18, 19 is 1:2:4, combination of 3-bit signals TTA1, $\overline{TTA1}$; TTA2, $\overline{TTA2}$; and TTA3, $\overline{TTA3}$ allows eight stages of capacitance value, 0 to 7, to be set. For example, when signal TTA1 is at "H" level and signal $\overline{TTA1}$ is at "L" level, transfer gate 14 is rendered conductive and capacitance value C of capacitors 17, 17 is applied to output node 8a of inverter 8. Oscillation frequency of oscillator 7 becomes smaller as capacitance value applied to output node 8a of inverter 8 becomes larger.

As will be described later, only transfer gate 16 among transfer gates 14 to 16 is rendered conductive when at an initialized state, and the fifth capacitance value among eight stages of the capacitance values is applied to output node 8a of inverter 8. Accordingly, regardless of whether the oscillation frequency of oscillator 7 is larger or smaller than the set value, the oscillation frequency of oscillator 7 can be changed.

Figure 4:
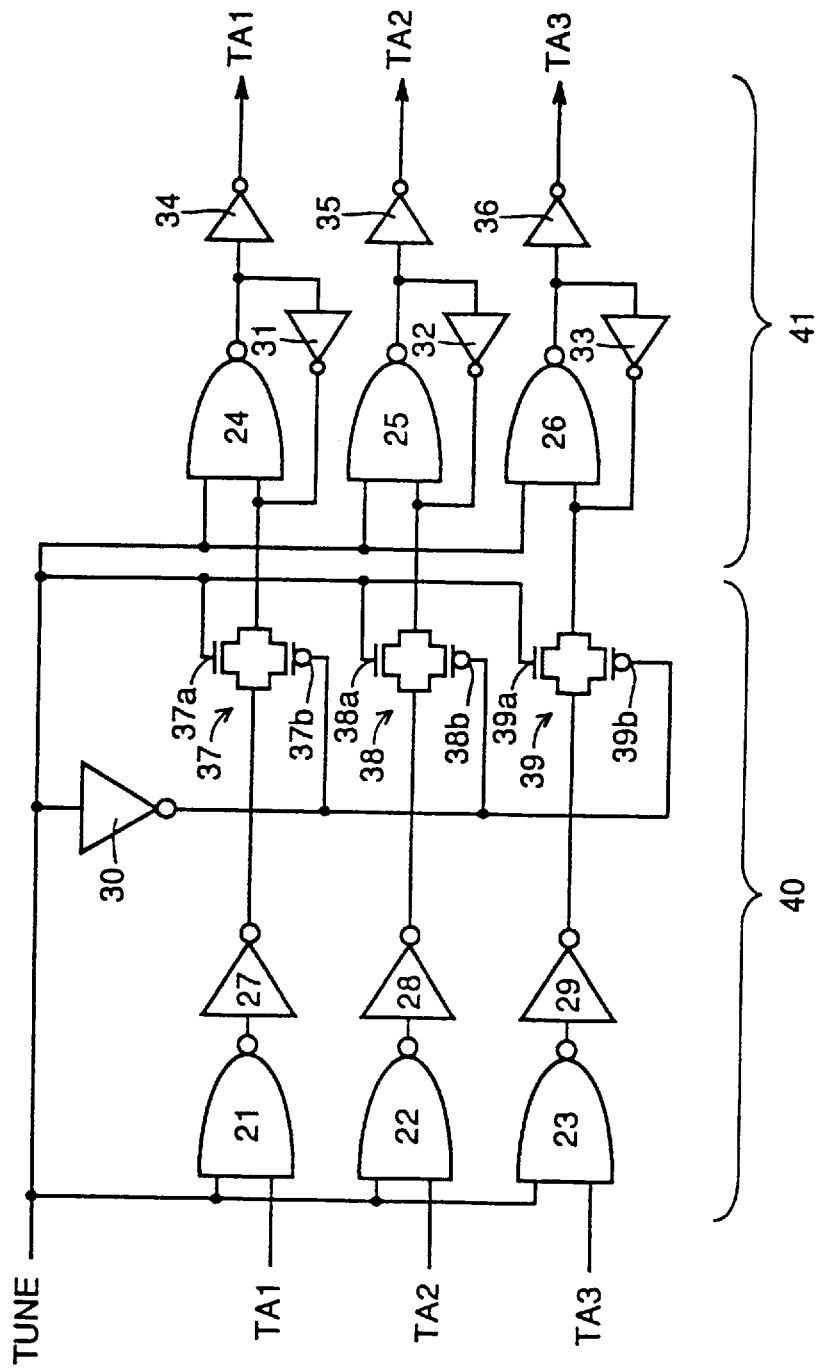
FIG. 4 is a circuit diagram showing a structure of an address incorporating portion in the internal timer shown in FIG. 2.

FIG. 4 is a circuit diagram showing the structure of the address incorporating portion 10 in FIG. 2. Referring to FIG. 4, address incorporating portion 10 includes NAND gates 21 to 26, inverters 27 to 36, and transfer gates 37 to 39. NAND gates 21 to 23, inverters 27 to 30 and transfer gates 37 to 39 form a gate circuit 40 which is rendered conductive in response to transition of tuning signal TUNE to "H" level. NAND gate 24 to 26 and inverters 31 to 36 form a latch circuit 41 for latching tuning address signals TA1 to TA3 which are input while tuning signal TUNE is at "H" level.

More specifically, tuning signal TUNE is input to of the input nodes of NAND gates 21 to 26. Also, tuning signal TUNE is input directly to gates 37a to 39a of transfer gates 37 to 39 at the side of N channel MOS transistors as well as to gate 37b to 39b of transfer gates 37 to 39 at the side of P channel MOS transistors.

Tuning address signals TA1 to TA3 are input to the other input nodes of NAND gates 21 to 23, respectively. Output of NAND gate 21 is input to the other input node of NAND gate 24 via inverter 27 and transfer gate 37. Output of NAND gate 22 is input to the other input node of NAND gate 25 via inverter 28 and transfer gate 38. Output of NAND gate 23 is input to the other input node of NAND gate 26 via inverter 29 and transfer gate 39. Outputs of NAND gates 24 to 26 are input to the other input nodes of NAND gates 24 to 26 via inverters 31 to 33, respectively. In addition, outputs of NAND gates 24 to 26 are input to tuning control portions 11 to 13 in FIG. 2 via inverters 34 to 36, respectively.

When tuning signal TUNE attains "H" level, gate circuit 40 becomes conductive and tuning address signal TA1 to TA3 are conducted to latch circuit 41. At this time, latch circuit 41 is also activated and latches tuning address signals TA1 to TA3 applied from gate circuit 40. The latched tuning address signals TA1 to TA3 are applied to tuning control portions 11 to 13, respectively.

On the contrary, when tuning signal TUNE attains "L" level, gate circuit 40 becomes non-conductive. At this time, latch circuit 41 is inactivated and the output of latch circuit 41 is reset to "L" level.

Figure 5:
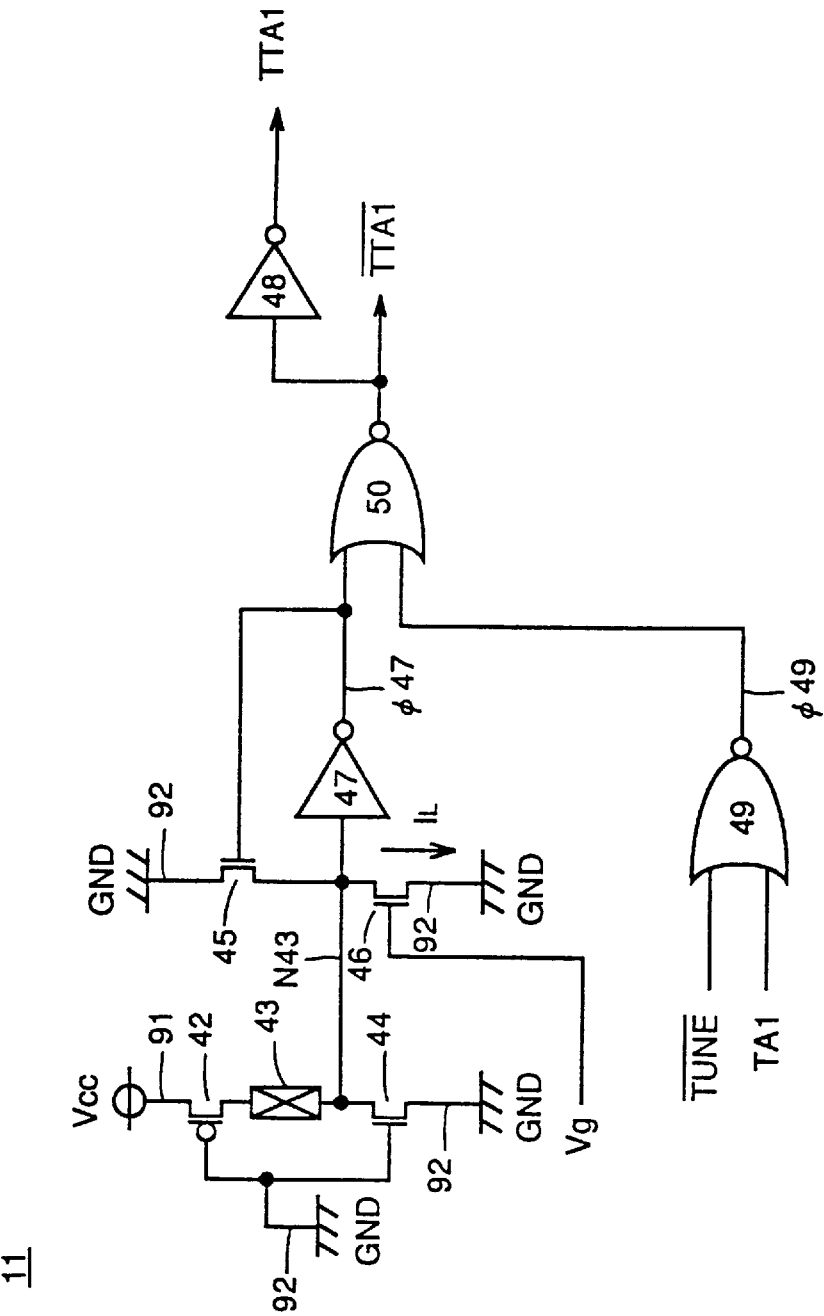
FIG. 5 is a circuit diagram showing a structure of a tuning control portion 11 in the internal timer shown in FIG. 2.

FIG. 5 is a circuit diagram showing the structure of the tuning control portion 11 in FIG. 2. Referring to FIG. 5, this tuning control portion 11 includes a P channel MOS transistor 42, a fuse 43, N channel MOS transistors 44 to 46, inverters 47, 48 and NOR gates 49, 50. Fuse 43 is formed of, for example, a polycrystalline silicon layer and can be disconnected by laser light.

P channel MOS transistor 42, fuse 43 and N channel MOS transistor 44 are connected in series between power supply line 91 and ground line 92. The gates of P channel MOS transistor 42 and N channel MOS transistor 44 are both connected to ground line 92. Connection node N43 of fuse 43 and N channel MOS transistor 44 is connected to the input node of inverter 47. N channel MOS transistor 45 is connected between node N43 and ground line 92, and its gate receives the output of inverter 47. N channel MOS transistor 46 is connected between node N43 and ground line 92, and its gate receives a fixed potential Vg. N channel MOS transistor 46 supplies a small amount of current $I_L$ from node N43 to ground line 92.

NOR gate 49 receives an inverted signal $\overline{TUNE}$ of tuning signal TUNE and tuning address signal TA1. NOR gate 50 receives an output φ47 of inverter 47 and an output φ49 of NOR gate 49. Output of NOR gate 50 becomes signal $\overline{TTA1}$ and is also inverted by inverter 48 to become a signal TTA1. Signals TTA1 and $\overline{TTA1}$ are respectively input to gates 14a and 14b of transfer gates 14 in variable capacitance circuit 9 shown in FIG. 3.

When fuse 43 is not disconnected, node N43 is at "H" level and output φ47 of inverter 47 is at "L" level. At the time when tuning is not performed in which fuse 43 is not disconnected and signal $\overline{TUNE}$ is at "H" level, output φ49 of NOR gate 49 attains "L" level and signals TTA1 and $\overline{TTA1}$ attains "L" level and "H" level, respectively. Therefore, transfer gate 14 of variable capacitance circuit 9 becomes non-conductive and capacitance value C of capacitors 17, 17 is not applied to output node 8a of inverter 8.

At the time when tuning is performed in which fuse 43 is not disconnected and signal $\overline{TUNE}$ is at "L" level, output φ49 of NOR gate 49 becomes an inverted signal of tuning address signal TA1. Accordingly, by changing the level of tuning address signal TA1, the state of transfer gate 14 in variable capacitance circuit 9 can be rendered conductive or non-conductive.

Meanwhile, when fuse 43 is disconnected, node N43 is at "L" level and output φ47 of inverter 47 is at "H" level. Thus, output of NOR gate 50, that is, signal $\overline{TTA1}$ always attains "L" level regardless of the state of signals $\overline{TUNE}$ and TT1. Accordingly, transfer gate 14 of variable capacitance circuit 9 is rendered conductive and capacitance value C of capacitors 17, 17 is applied to output node 8b a of inverter 8.

The structure of tuning control portion 12 is the same as that of tuning control portion 11. However, in tuning control portion 12, a tuning address signal TA2 is input instead of tuning address signal TA1, and signals TTA2, $\overline{TTA2}$ are output instead of signals TTA1, $\overline{TTA1}$.

Figure 6:
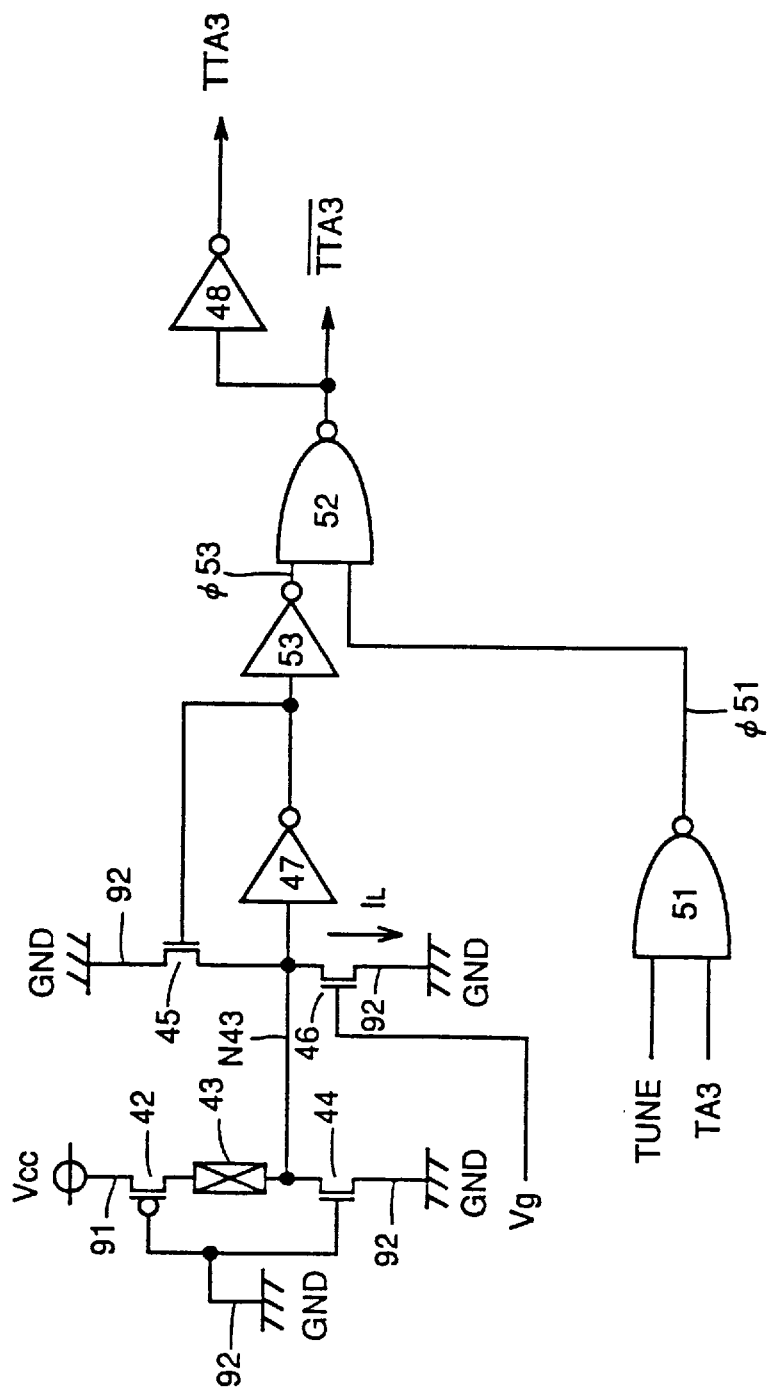
FIG. 6 is a circuit diagram showing a structure of a tuning control portion 13 in the internal timer shown in FIG. 2.

FIG. 6 is a circuit diagram showing the structure of tuning control portion 13 in FIG. 2. Referring to FIG. 6, this tuning control portion 13 differs from tuning control portion 11 shown in FIG. 5 in that NOR gates 49, 50 are replaced by NAND gates 51, 52, respectively, and inverter 53 is newly provided. Inverter 53 is connected between the gate of an N channel MOS transistor 45 as well as output node of an inverter 47 and one input node of NAND gate 52. NAND gate 51 receives signals $\overline{TUNE}$ and TA3. NAND gate 52 outputs a signal $\overline{TTA3}$ and inverter 48 outputs a signal TTA3.

When fuse 43 is not disconnected, node N43 is at "H" level and output φ53 of inverter 53 is at "H" level. At the time when tuning is not performed in which fuse 43 is not disconnected and signal TUNE is at "L" level, output φ51 of NAND gate 51 attains "H" level and signals TTA3 and $\overline{TTA3}$ attain "H" level and "L" level, respectively. Therefore, transfer gate 16 of variable capacitance circuit 9 is rendered conductive and capacitance value 4C of capacitors 19, 19 is applied to output node 8a of inverter 8.

At the time when tuning is performed in which fuse 43 is not disconnected and signal TUNE is at "H" level, output φ51 of NAND gate 51 becomes an inverted signal of tuning address signal TA3. Accordingly, by changing the level of tuning address signal TA3, the state of transfer gate 16 of variable capacitance circuit 9 can be rendered conductive or non-conductive.

Meanwhile, when fuse 43 is disconnected, node N43 attains "L" level and output φ53 of inverter 53 attains "L" level. Thus, output of NAND gate 52, that is, signal $\overline{TTA3}$ would always be at "H" level, regardless of the state of signals TUNE and TA3. Therefore, transfer gate 16 of variable capacitance circuit 9 is made non-conductive and capacitance value 4C of capacitor 19, 19 is not applied to output node 8a of inverter 8.

Figure 7:
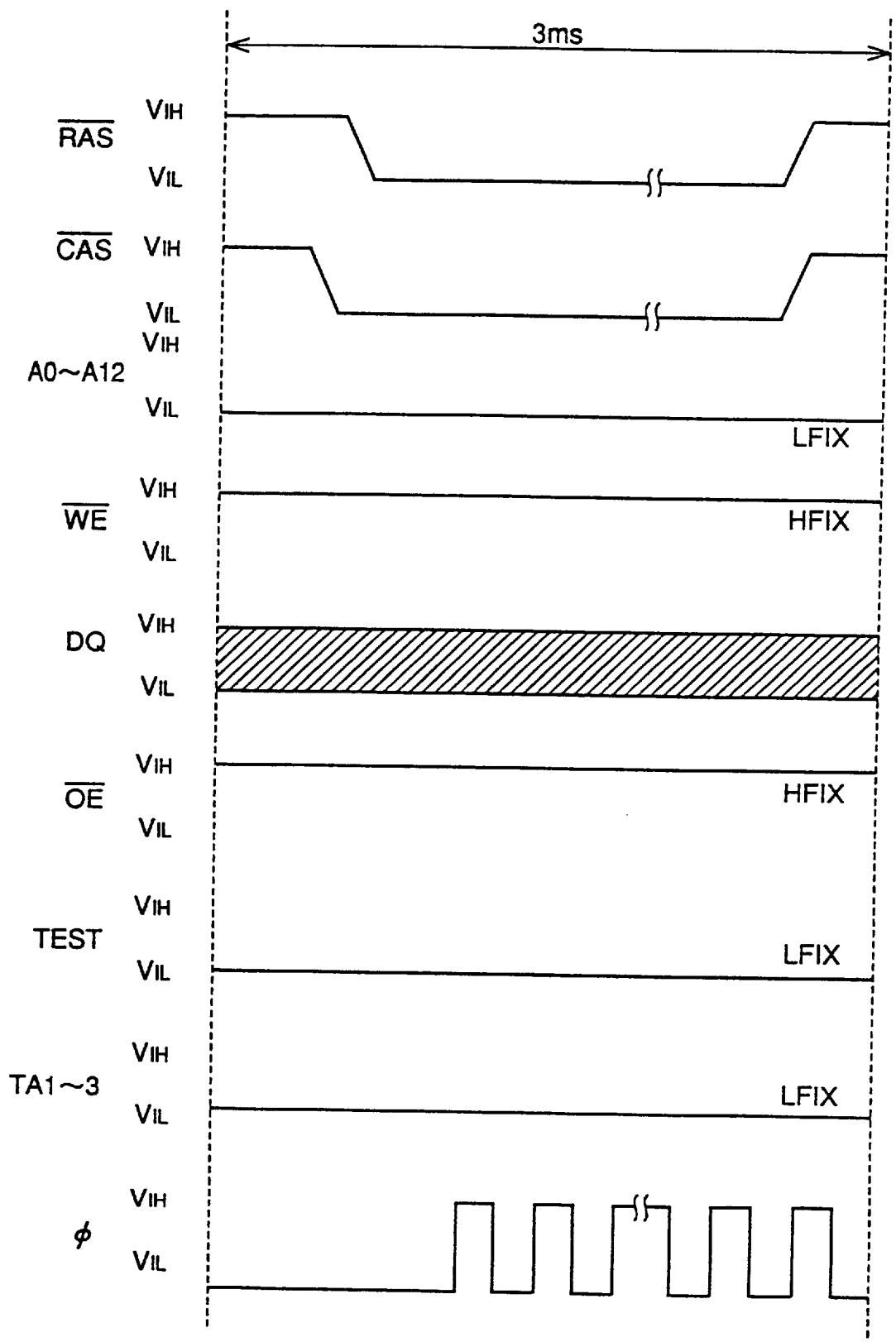
FIG. 7 is a timing chart illustrating the method of activating the internal timer shown in FIG. 2.

FIG. 7 is a timing chart for illustrating how the operation of internal timer 1 is started. When the order of the rise of externally applied control signals $\overline{CAS}$ and $\overline{RAS}$ is reversed from that of the normal operation, a signal CBR ($\overline{CAS}$ before $\overline{RAS}$) is generated within the DRAM chip. Internal timer 1 starts operating when a prescribed time period has elapsed after the generation of signal CBR so as to output clock signal φ.

Address signals A0 to A12, control signals $\overline{WE}$, $\overline{OE}$ test signal TEST and tuning address signals TT1 to TA3 are all fixed at an inactive state. In addition, input and output of data DQ is stopped.

Figure 8:
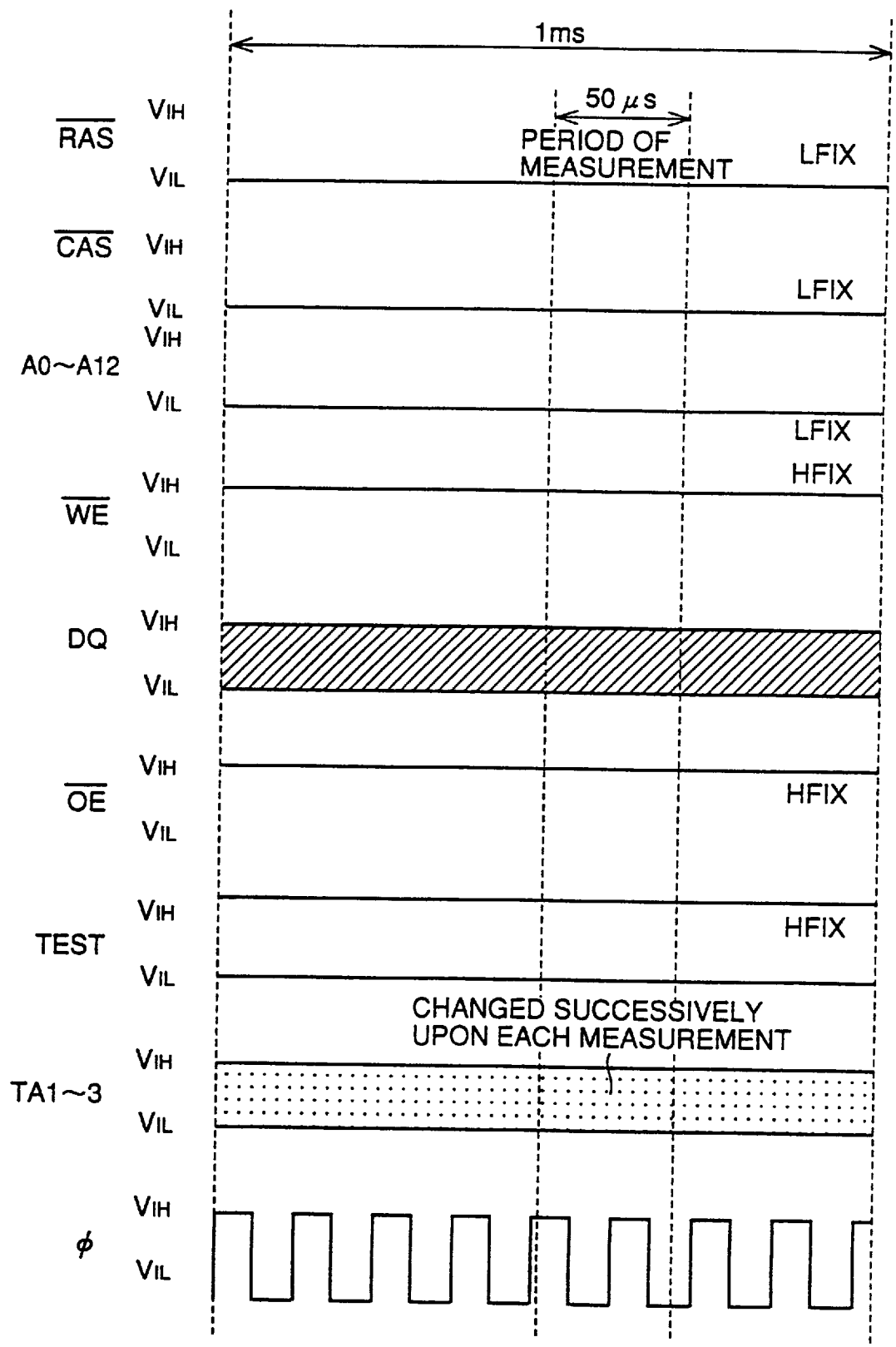
FIG. 8 is a timing chart illustrating the method of tuning the internal timer shown in FIG. 2.

FIG. 8 is a timing chart for illustrating the method of tuning internal timer 1. After activating internal timer 1 by the method illustrated in FIG. 7, test signal TEST is fixed at an activated state, i.e., "H" level so that transfer gate 3 in FIG. 1 is made conductive and clock signal φ is input to tester 6.

When the frequency of clock signal φ is measured by tester 6 and it turns out that this frequency is within an allowable range around the set value, tuning is completed and the chip is shipped as a normal product.

If the frequency of clock signal φ is offset from the allowable range around the set value, tuning address signals TT1 to TA3 are varied successively to switch the capacitance of output node 8a of inverter 8, and tuning address signals TT1 to TA3 by which the frequency of clock signal φ would be closest to the set value is obtained. Thereafter, fuse 43 of tuning control portions 11 to 13 is disconnected such that signals TTA1, $\overline{TTA1}$; TTA2, $\overline{TTA2}$, TTA3, $\overline{TTA3}$ would be obtained, giving the same results as in the case when tuning address signals TT1 to TA3 are input. Thus, the oscillation frequency of oscillator 7 is set to a value which is substantially the same as the set value.

Figure 9:
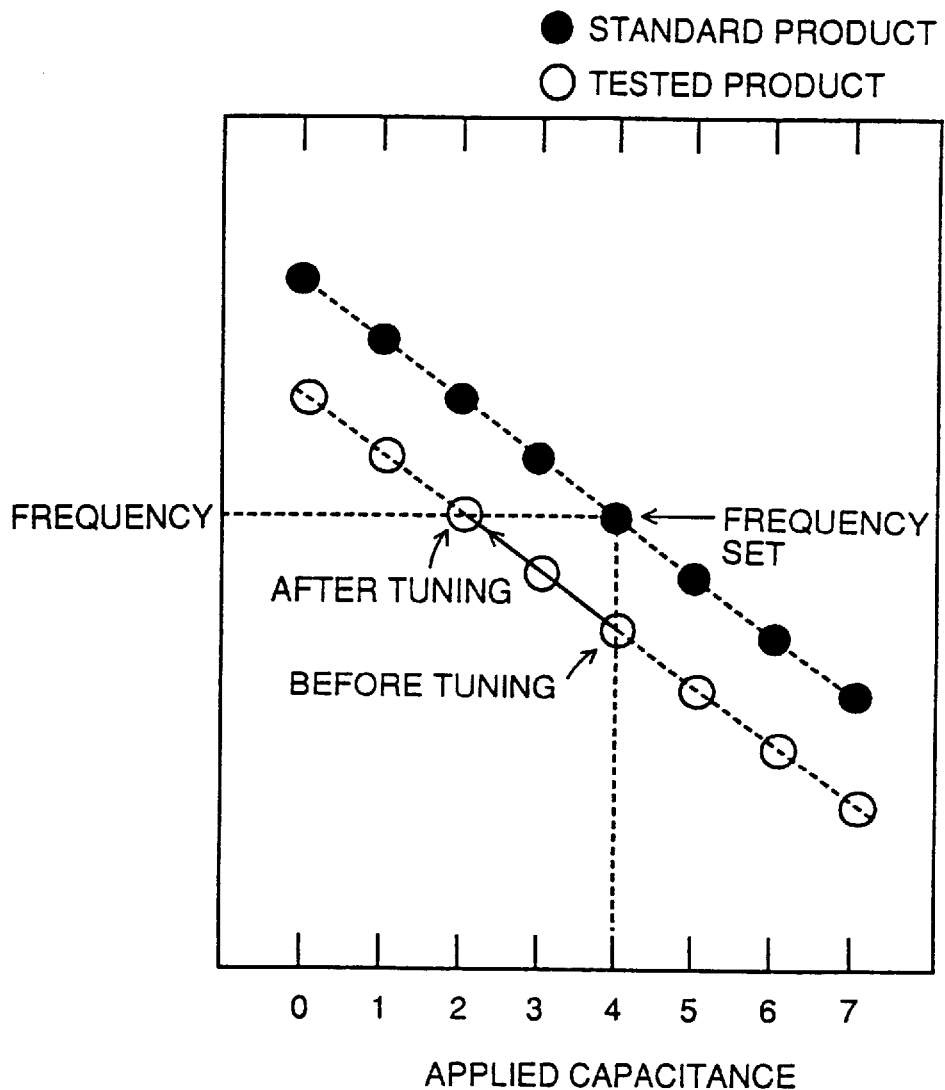
FIG. 9 illustrates a method of tuning the internal timer shown in FIG. 2.

FIG. 9 shows the situation in which the applied capacitance of the product being tested which has a clock signal φ with a frequency lower than that of the standard product is set to a value (2) lower than the standard value (4) by two stages, and the frequency of the clock signal φ has become the set value.

In the DRAM chip according to this embodiment, even when the oscillation frequency of oscillator 7 in internal timer 1 is offset from the set value due to inconstancy in manufacturing, the oscillation frequency of the oscillator 7 can be made closer to the set value by disconnecting fuse 43 so that there would be no problem such as unnecessarily large power dissipation or inaccurate operation.

When tuning is performed to a wafer, it is preferred that a pad for inputting signals is provided on the chip and signals TEST, TUNE, TT1 to TA3 are input from a probe card to the chip via a probe and the pad.

When tuning is performed when sealed in mold resin, address key or command register may be used to input signals TEST, TUNE, and TA1 to TA3.

Also, a signal generating circuit which generates signal TEST or TUNE depending on the relationship between the input timing of the external control signals may be provided in the chip.

Moreover, the order of amplifier 2 and transfer gate 3 may be reversed. In addition, signal TEST may be input also to amplifier 2 so that amplifier 2 is activated only when the test is performed. In this case, amplifier 2 does not operate at other times and thus power consumption would be reduced.

When load driving capability of clock signal φ is large, amplifier 2 is not necessary. Also, when amplifier 2 is provided at the side of tester 6, it is not necessary to provide amplifier 2 in DRAM chip.

Figure 10:
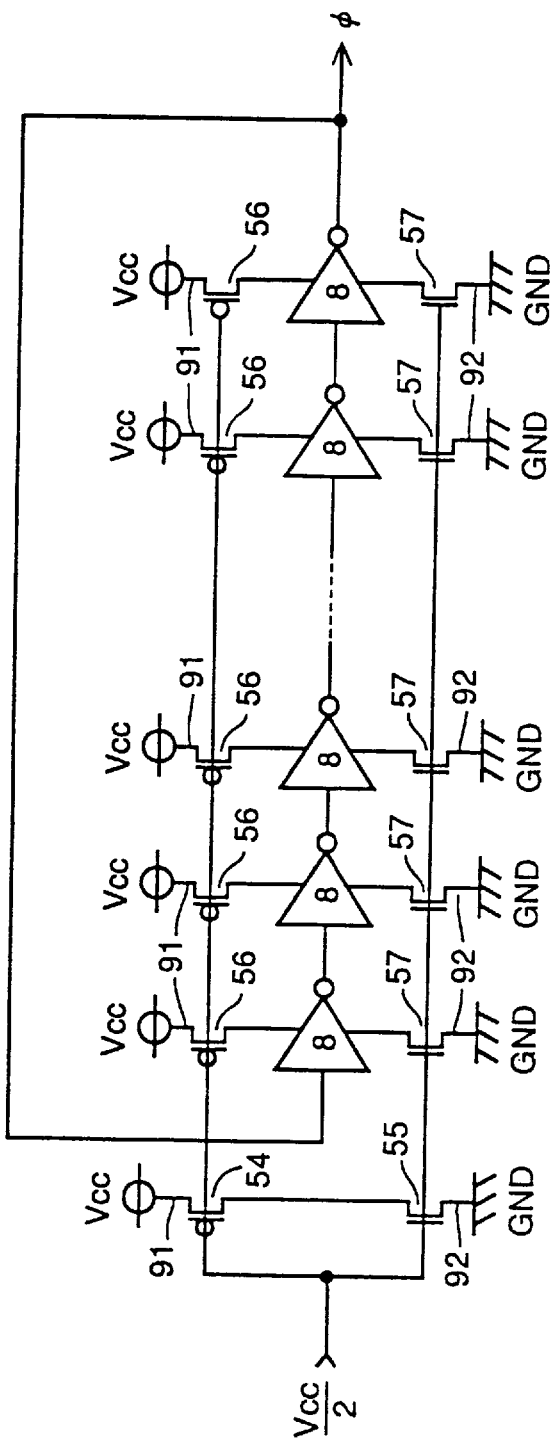
FIG. 10 is a partially omitted circuit diagram showing an improved example of the internal timer shown in FIG. 2.
Figure 11:
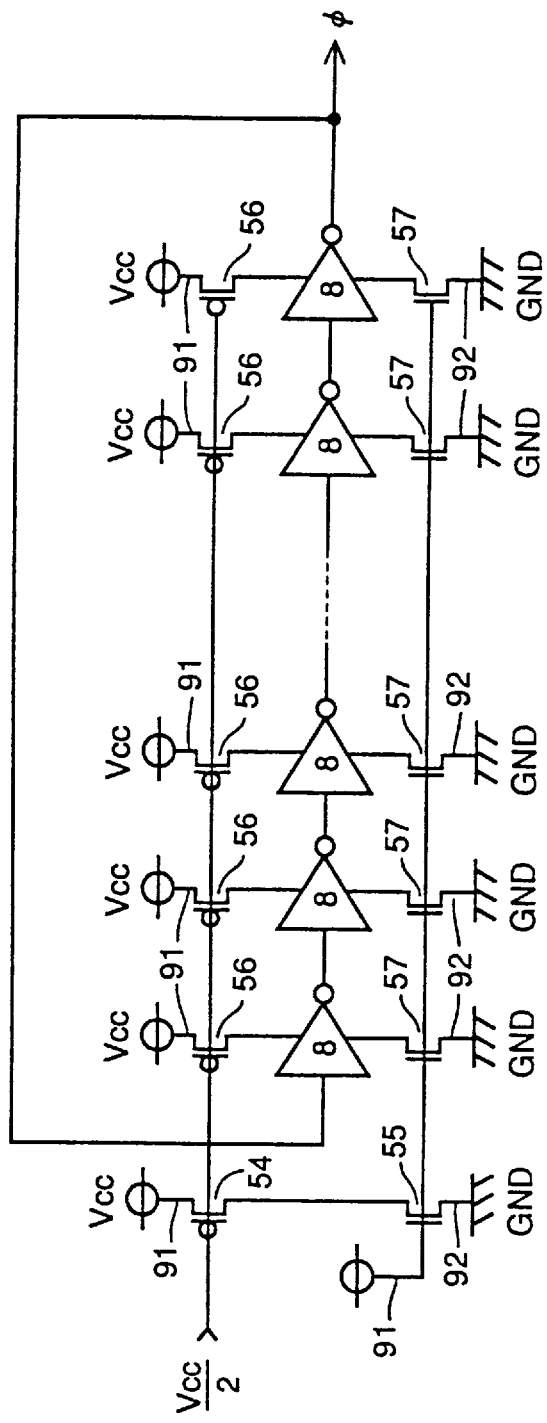
FIG. 11 is a partially omitted circuit diagram showing another improved example of the internal timer shown in FIG. 2.
Figure 12:
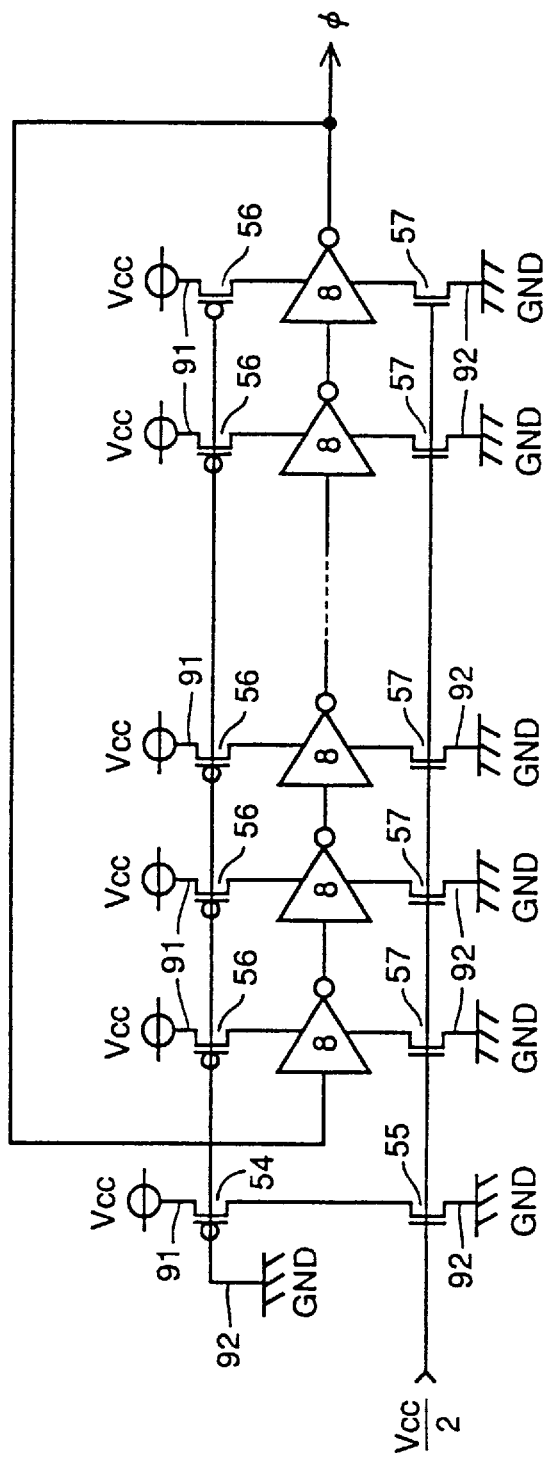
FIG. 12 is a partially omitted circuit diagram showing a still another improved example of the internal timer in FIG. 2.

In addition, the penetrating current flowing from the power supply node of each inverter 8 to the ground node can be suppressed such that it would be possible to reduce the power consumption when a P channel MOS transistor 56 is connected between the power supply node of each inverter 8 in oscillator 7 and power supply line 91, an N channel MOS transistor 57 is connected between the ground node of each inverter 8 and the ground line 92, a P channel MOS transistor 54 and an N channel MOS transistor 55 are connected in series between the power supply potential line 91 and the ground line 92, and the gates of MOS transistors 54 to 56 are supplied with an intermediate potential Vcc/2 between power supply potential Vcc and ground potential GND, as shown in FIG. 10. A similar effect can also be obtained if intermediate potential Vcc/2 is applied to the gates of P channel MOS transistors 54, 56 and power supply potential Vcc is applied to the gates of N channel MOS transistors 55, 57 as shown in FIG. 11. Also, when intermediate potential Vcc/2 is applied to the gates of N channel MOS transistors 55, 57 and ground potential GND is applied to the gates of P channel MOS transistors 54, 56 as shown in FIG. 12, a similar effect can be obtained.

Although the description has been made for a case in which the present invention is applied to a DRAM including internal timer 1 in this embodiment, it is not to be taken by way of limitation. The present invention can also be applied to DRAM and SDRAM (synchronous DRAM) including a timer for self-refreshing, SDRAM and SRAM (static random access memory) including synchronous clock generating circuit, and DRAM, SDRAM and SRAM including a timer for internal operation control to cause an automatic cyclic operation of the internal circuits when the test is performed. In addition, the present invention can be applied not only to a memory but also to ASIC device and processor chips for ATM including synchronous clock generating circuit. The present invention is also applicable to a PLL circuit including an oscillator and a DLL circuit including a delay circuit.

[Embodiment 2]

After tuning is performed, the frequency of clock signal φ is fixed at a prescribed value. However, when the margin of the operation of the chip is tested, the period of the clock signal φ must be made shorter. In addition, the frequency of clock signal φ must be traced without fail. Thus, in this embodiment, a DRAM chip in which a clock signal $\phi_{TEST}$ for testing can be input externally is implemented.

Figure 13:
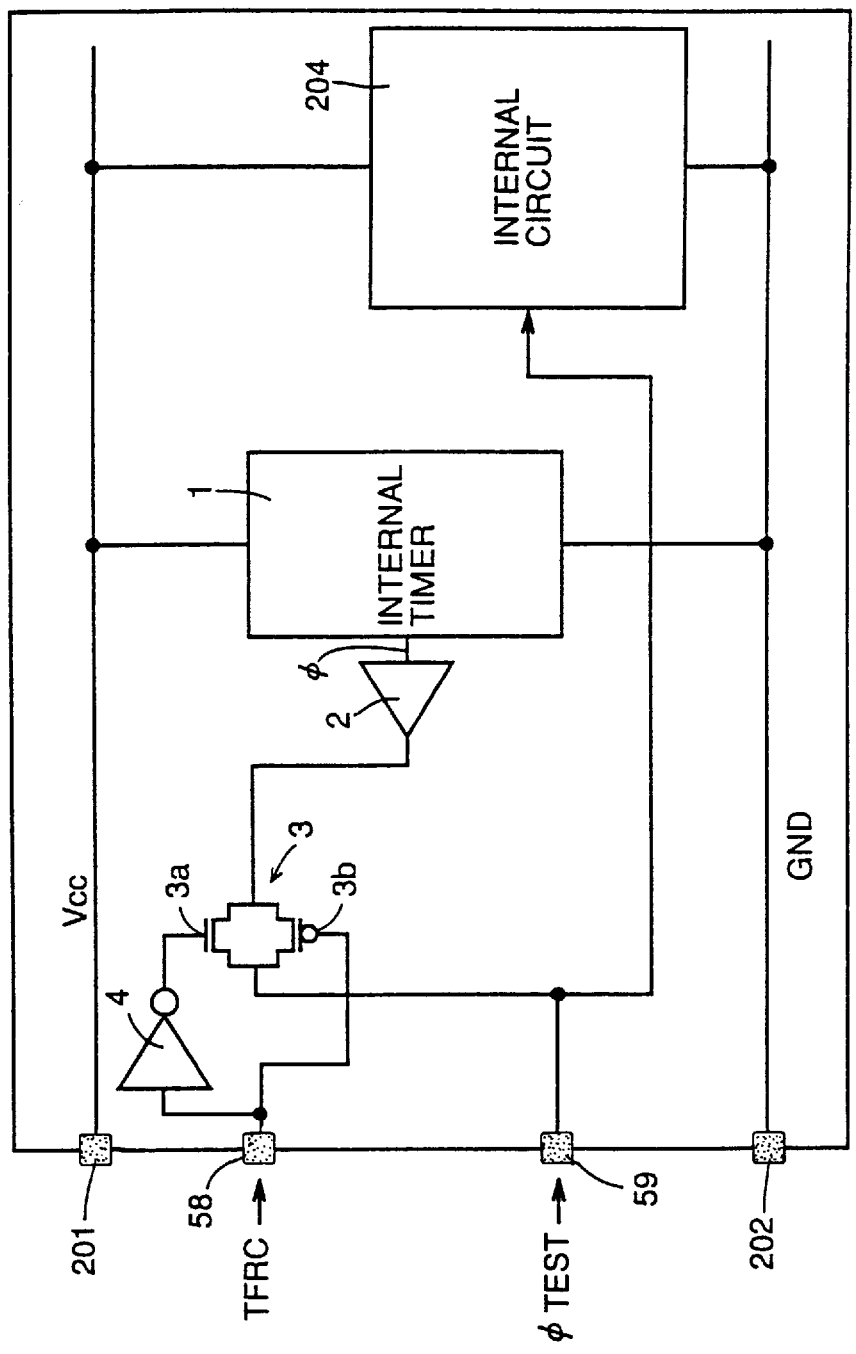
FIG. 13 is a block diagram showing a structure of a DRAM chip according to Embodiment 2 of the present invention.

FIG. 13 is block diagram showing a structure of a DRAM chip according to Embodiment 2 of the present invention.

Referring to FIG. 13, this DRAM chip includes a power supply terminal 201, a ground terminal 202, an internal circuit 204, an internal timer 1, an amplifier 2, a transfer gate 3 and an inverter 4, as in the case of DRAM chip in FIG. 1. In addition, this DRAM chip further includes a control signal input terminal 58 and a signal input/output terminal 59.

Clock signal φ output from internal timer 1 is input to amplifier 2. Transfer gate 3 has its one electrode connected to an output node of amplifier 2 and the other electrode connected to signal input/output terminal 59 and internal circuit 204. Control signal input terminal 58 is supplied with control signal TFRC externally. Control signal TFRC is input to gate 3a of transfer gate 3 at the side of N channel MOS transistor via inverter 4 while being input directly to gate 3b of transfer gate 3 at the side of P channel MOS transistor.

At ordinary times and at the time of tuning described above, control signal TFRG is set at "L" level, and clock signal φ generated at internal timer 1 is output externally via transfer gate 3 and signal input/output terminal 59 while being input to internal circuit 204 via transfer gate 3.

When the operation margin is tested, control signal TFRC is set at "H" level and transfer gate 3 is fixed at a non-conductive state. Then, clock signal $\phi_{TEST}$ for testing is input to internal circuit 204 externally through signal input/output terminal 59, so as to test the margin of the operation of DRAM chip.

In this embodiment, the same effect as that of Embodiment 1 is obtained. In addition, operation margin of DRAM chip can be tested by inputting externally a clock signal $\phi_{TEST}$ for testing.

[Embodiment 3]

Although the oscillation frequency of the oscillator was changed by changing the capacitance value applied to output node 8a of inverter forming the oscillator in Embodiment 1, the oscillation frequency of the oscillator is changed by changing the driving current of the inverter in this embodiment 3.

Figure 14:
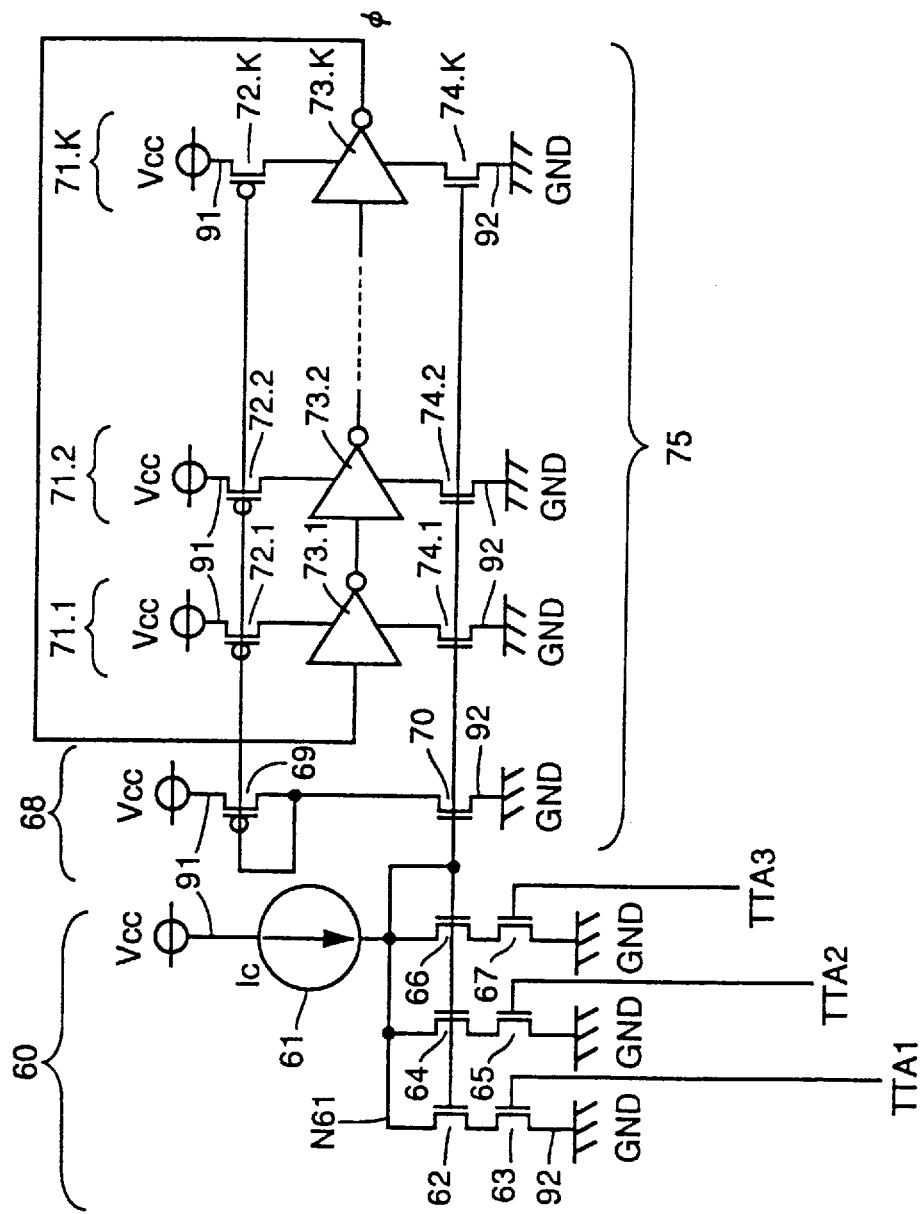
FIG. 14 is a partially omitted circuit diagram showing a structure of an internal timer of a DRAM chip according to Embodiment 3 of the present invention.

FIG. 14 is a partially omitted circuit diagram showing the principal portions of an internal timer in a DRAM chip according to Embodiment 3 of the present invention. Referring to FIG. 14, this internal timer includes a current setting portion 60 and a voltage controlled oscillator 75. Voltage controlled oscillator 75 includes a bias generating circuit 68 and delay time variable elements 71.1–71.K of K stages (K being an odd number not smaller than 3) connected in a ring shape.

Current setting portion 60 includes a constant current source 61 and N channel MOS transistors 62 to 67. Constant current source 61 is connected between a power supply line 91 and a node N61. N channel MOS transistors 62 and 63, 64 and 65, as well as 66 and 67, respectively, are connected in series between node N61 and ground lines 92. Gates of N channel MOS transistors 62, 64 and 66 are connected commonly while being connected to node N61. Gates of N channel MOS transistors 63, 65, and 66 receive signals TTA1, TTA2 and TTA3, respectively. Signals TTA1 to TTA3 are produced at address incorporating portion 10 and tuning control portion 11 to 13 shown in FIG. 2.

Bias generating circuit 68 includes a P channel MOS transistor 69 and an N channel MOS transistor 70 connected in series between power supply line 91 and ground line 92. P channel MOS transistor 69 has its gate connected to its drain. N channel MOS transistor 70 has its gate connected to node N61.

Delay time variable element 71.1 include an inverter 73.1, a P channel MOS transistor 72.1 connected between power supply node of inverter 73.1 and power supply line 91, and an N channel MOS transistor 74.1 connected between the ground node of inverter 73.1 and ground line 92. P channel MOS transistor 72.1 has its gate connected to the gate of P channel MOS transistor 69 in bias generating circuit 68. N channel MOS transistor 74.1 has its gate connected to the gate of N channel MOS transistor 70 in bias generating circuit 68. Structures of other delay time variable elements 71.2 to 71.K are the same as that of delay time variable element 71.1.

Here, N channel MOS transistors 62, 64, 66, 70, 74.1 to 74.K constitute a current mirror circuit with one another. P channel MOS transistors 69, 72.1 to 72.K constitute a current mirror circuit with one another. In addition, since N channel MOS transistor 70 and P channel MOS transistor 69 are connected in series, current of the same value flows through MOS transistors 69, 70, 72.1 to 72.K, 74.1 to 74.K.

If only the signal TTA3 among the signals TTA1 to TTA3 is set at an "H" level, only N channel MOS transistor 67 among N channel MOS transistors 63, 65, 67 is rendered conductive, all of current Ic from constant current source 61 flows into N channel MOS transistors 66 and 67, and a potential corresponding to current Ic appears at the gate of N channel MOS transistor 66. Accordingly, current Ic of the same value flows through MOS transistors 69, 70, 72.1 to 72.K, 74.1 to 74.K. At this time, driving current of each inverter 73.1 to 73.K and the oscillation frequency of voltage controlled oscillator 75 are maximized.

When all of signals TTA1 to TTA3 is set at "H" level, all of N channel MOS transistors 63, 65 and 67 are rendered conductive. In this case, current Ic of constant current source 61 is divided equally into three portions so as to flow into N channel MOS transistors 62 and 63, 64 and 65, and 66 and 67. A potential corresponding to current Ic/3 appears at the gates of N channel MOS transistors 62, 64 and 65. Accordingly, current Ic/3 flows into MOS transistors 69, 70, 72.1 to 72.K, 74.1 to 74.K. At this time, driving current at each inverter 73.1 to 73.K and oscillation frequency of voltage controlled oscillator 75 are minimized.

In this embodiment, the same effect as that of Embodiment 1 is obtained. In addition, the layout area is made smaller than in Embodiment 1 since there is no need to provide a capacitor.

[Embodiment 4]

Figure 15:
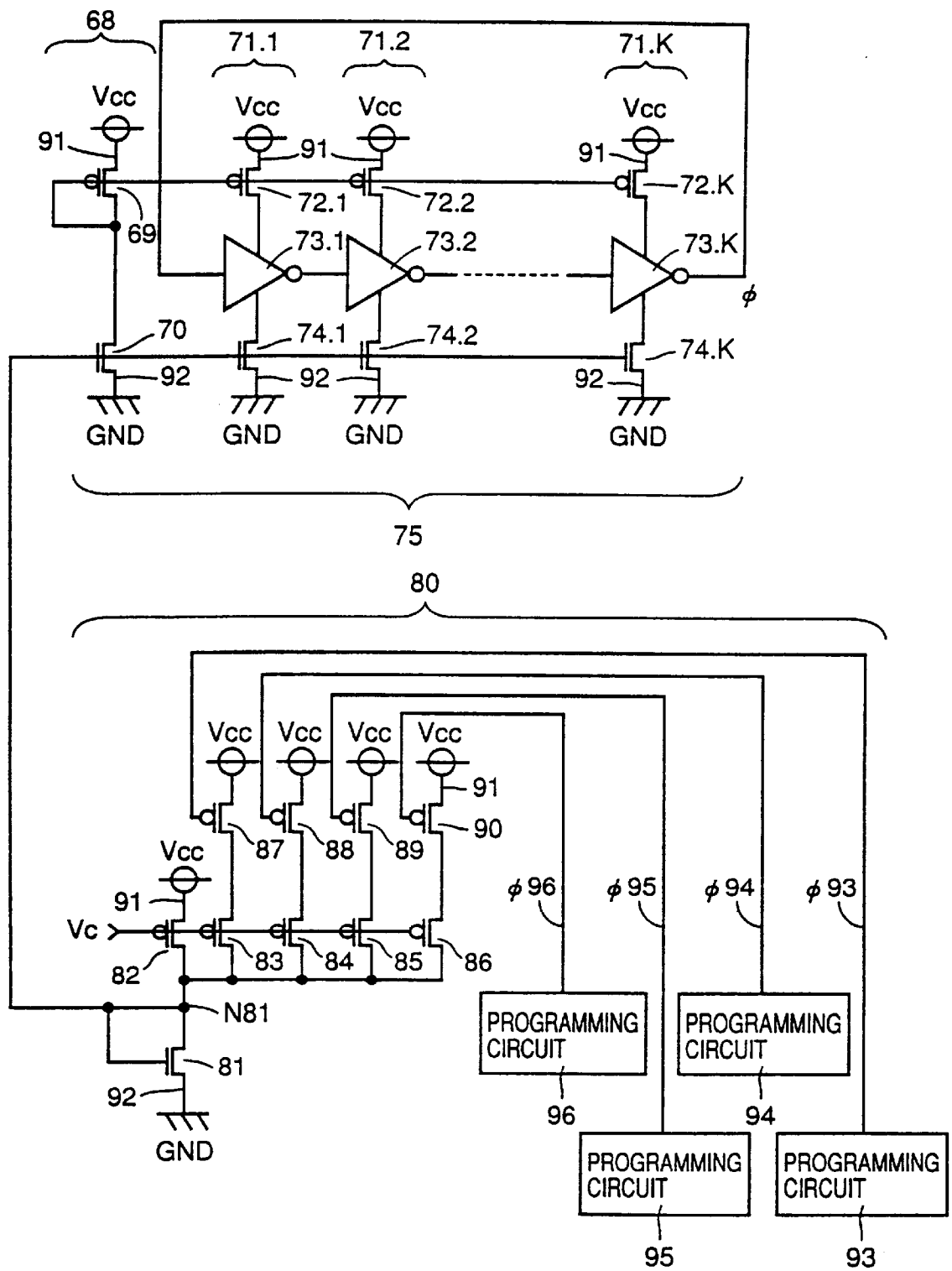
FIG. 15 is a partially omitted circuit block diagram showing a structure of an internal timer of DRAM chip according to Embodiment 4 of the present invention.

FIG. 15 is a partially omitted circuit block diagram showing a structure of an internal timer of a DRAM chip according to Embodiment 4 of the present invention. Referring to FIG. 15, this internal timer includes a voltage controlled oscillator 75 and a current setting portion 80. Since voltage controlled oscillator 75 is identical to that of FIG. 14, description thereof is not given.

Current setting portion 80 includes an N channel MOS transistor 81, P channel MOS transistors 82 to 90, and programming circuits 93 to 96. P channel MOS transistor 82 and N channel MOS transistor 81 are connected in series between a power supply line 91 and a ground line 92. N channel MOS transistor 81 has its gate connected to the gates of N channel MOS transistors 70, 74.1 to 74.K as well as to its own drain (i.e., node N81). P channel MOS transistors 87 and 83, 88 and 84, 89 and 85 as well as 90 and 86 are connected in series between power supply line 91 and node N81, respectively. A prescribed potential Vc is applied to the gates of P channel MOS transistors 82 to 86 so that each of them would have a prescribed resistance value. The gates of P channel MOS transistors 87 to 90 are provided with signals φ93 to φ96, respectively. Signals φ93 to φ96 are output from programming circuits 93 to 96, respectively.

More specifically, P channel MOS transistors 87 and 83, 88 and 84, 89 and 85, as well as 90 and 86 form constant current sources controlled by signals φ93 to φ96, respectively.

Figure 16:
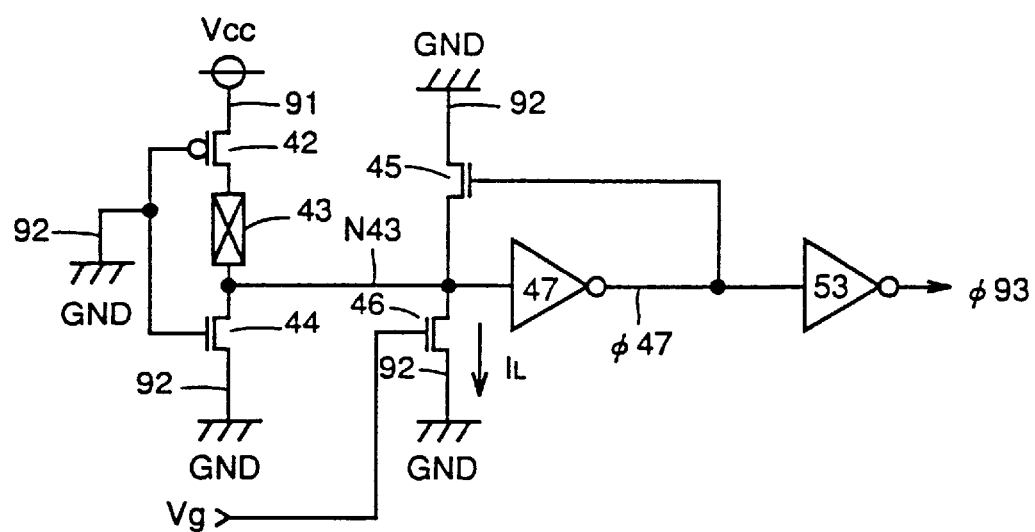
FIG. 16 is a circuit diagram showing a structure of a programming circuit shown in FIG. 5.

FIG. 16 is a circuit diagram showing a structure of programming circuit 93. Referring to FIG. 16, this programming circuit 93 differs from the tuning control portion 13 of FIG. 6 in that it is not provided with inverter 48 and NAND gates 51, 52. In other words, the output of an inverter 53 is signal φ93. When a fuse 43 is not disconnected, node N43 would be at "H" level and signal φ93 would also be at "H" level. When fuse 43 is disconnected, node N43 would be at "L" level and signal 4)93 would also be "L" level. Structure and operation of programming circuits 94 to 96 are identical to those of programming circuit 93.

Operation of this internal timer will now be described in the following. When fuses 43 of programming circuits 93 to 96 are not disconnected and signals φ93 to φ96 are set at "H" level, P channel MOS transistors 87 to 90 are rendered non-conductive so that current flows only to P channel MOS transistor 82 among P channel MOS transistors 82 to 86. Assuming that the current flowing at this time is Ic, a potential corresponding to current Ic appears at the gate of N channel MOS transistor 81. Thus, current Ic flows into MOS transistors 69, 70, 72.1 to 72.K, 74.1 to 74.K of voltage controlled oscillator 75. At this time, driving current of each of the inverters 73.1 to 73.K is minimized and oscillation frequency of voltage controlled oscillator 75 is also minimized.

When fuses 43 of programming circuits 93 to 96 are all disconnected and signals φ93 to φ96 are set at "L" level, P channel MOS transistors 87 to 90 are rendered conductive and current Ic flows to each of P channel MOS transistors 82 to 86. At this time, a potential corresponding to current 51c appears at the gate of N channel MOS transistor 81, driving current of inverters 73.1 to 73.K of voltage controlled oscillator 75 is maximized, and oscillation frequency of voltage controlled oscillator 75 is also maximized.

An effect similar to that of Embodiment 3 can also be obtained in this embodiment.

Although programming circuits 93 to 96 are employed to set P channel MOS transistors 87 to 90 at conductive or non-conductive state in this embodiment, it is not to be taken by way of limitation, and tuning control portion 13 of FIG. 6 or a non-volatile memory may also be used.

Although current Ic of the same value flows into each of P channel MOS transistors 82 to 86 in this embodiment, the values of the current may be different. Thus, the current flowing into N channel MOS transistor 81 is not limited to an integer multiple of the value of the current flowing into P channel MOS transistor 82 but may be set at an arbitrary real number multiple of the same.

[Embodiment 5]

Figure 17:
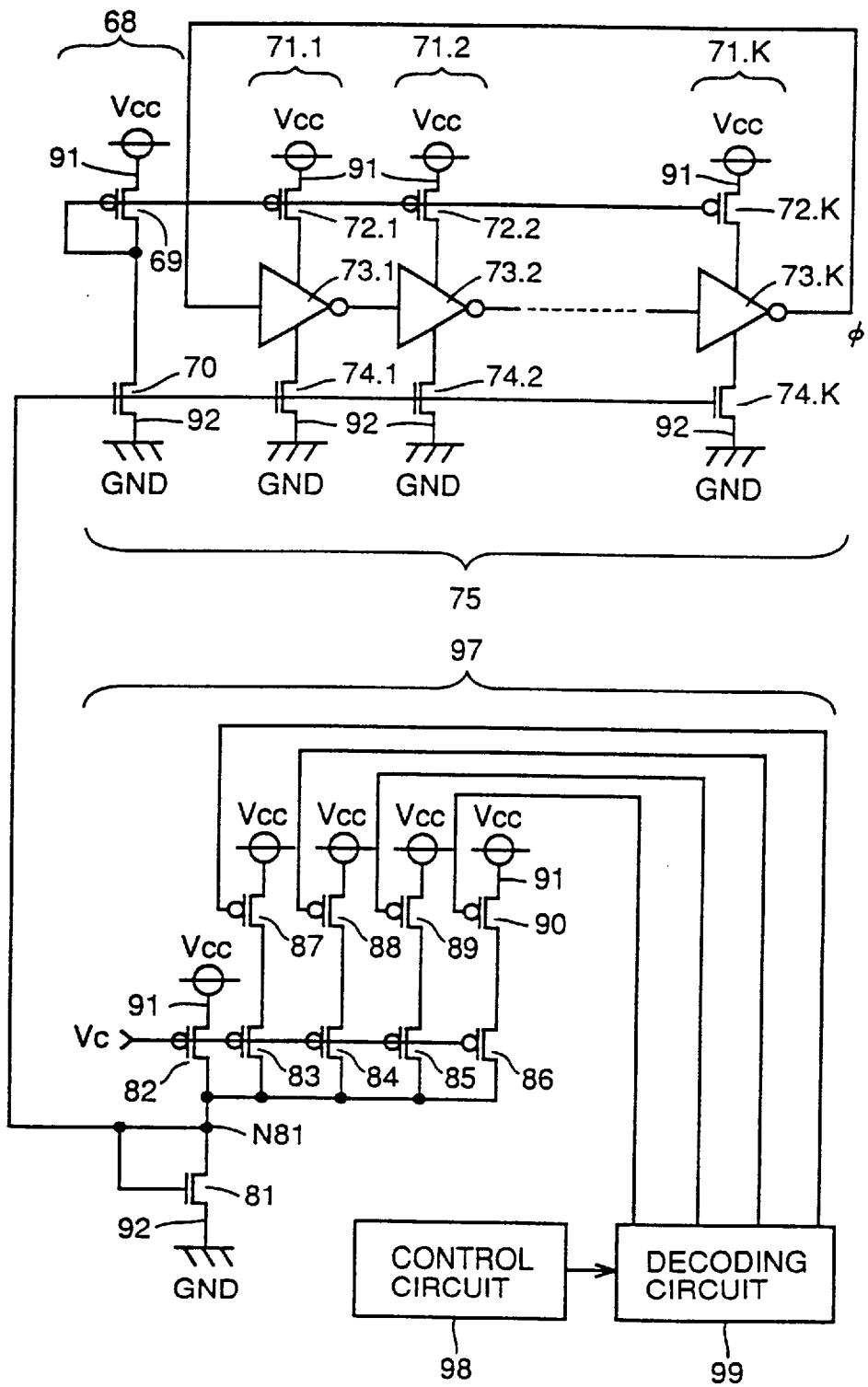
FIG. 17 is a partially omitted circuit diagram showing a structure of an internal timer of a DRAM chip according to Embodiment 5 of the present invention.
Figure 18:
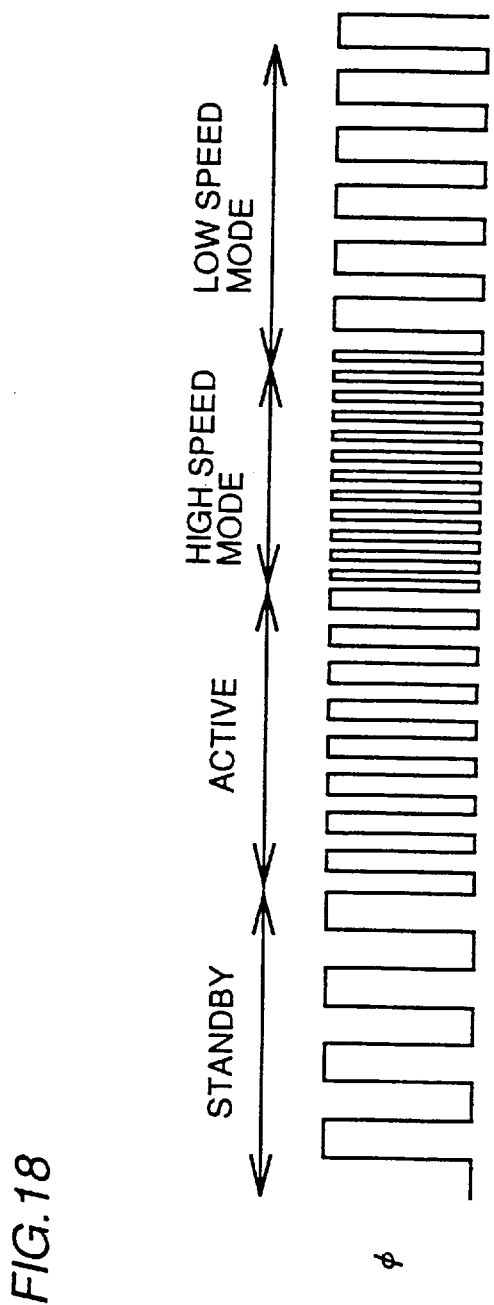
FIG. 18 shows a waveform of a clock signal output from the internal timer in FIG. 17.

FIG. 17 is a partially omitted circuit block diagram showing a portion of an internal timer of a DRAM chip according to Embodiment 5 of the present invention. FIG. 18 shows the waveform of a clock signal φ output from the internal timer 17 of FIG. 18.

Referring to FIG. 17, this internal timer includes a voltage controlled oscillator 75 and a current control portion 97. This current control portion 97 differs from current setting portion 80 in FIG. 15 in that it is provided with a control circuit 98 and a decoding circuit 99 instead of programming circuits 93 to 96.

Control circuit 98 senses which of the plurality of operation modes the DRAM is set at, and outputs a signal corresponding to the sensed result to decoding circuit 99. Decoding circuit 99 controls each of the P channel MOS transistors 87 to 90 so that it would be rendered conductive or non-conductive, according to the output signal from control circuit 98.

The operation of this internal timer will be described next. When the DRAM is at a standby state, control circuit 98 and decoding circuit 99 render P channel MOS transistors 87 to 90 non-conductive and set the current flowing into N channel MOS transistor 81 at Ic, setting the oscillation frequency of the voltage controlled oscillator 75 at a minimum value.

When DRAM is made active, it is necessary to operate the internal circuit of DRAM and thus control circuit 98 and decoding circuit 99 render P channel MOS transistors 87 to 89, for example, conductive and set the current flowing into N channel MOS transistor 81 at 4Ic, setting the oscillation frequency of the voltage control oscillator 75 at a higher value.

Also, when DRAM enters a high speed mode such as a high speed output mode (EDO), it is necessary to operate the internal circuit faster than in the normal active state and thus control circuit 98 and decoding circuit 99 render all of P channel MOS transistors 83 to 86 conductive and set the current flowing into N channel MOS transistor 81 at 5Ic, setting the oscillation frequency of the voltage controlled oscillator 75 at a maximum value.

In addition, when the DRAM enters a low speed mode such as self-refresh mode, control circuit 98 and decoding circuit 99 render, for example, P channel MOS transistor 83 only and set the current flowing into N channel MOS transistor 81 at 2Ic, setting the oscillation frequency of voltage controlled oscillator 75 at a low value.

Since voltage controlled oscillator 75 oscillates at a frequency corresponding to the operation mode of the DRAM in this embodiment, each operation mode is performed accurately. In addition, waste of power is reduced, such that power consumption would be reduced.

[Embodiment 6]

In a DRAM, charge pump circuits for producing a negative potential such as substrate potential $V_{BB}$ and for producing a potential such as word line potential Vpp which is higher than power supply potential Vcc are provided. The charge pump circuit is driven by a clock signal φ produced at an internal timer and discharges negative or positive charge. Accordingly, charge discharging ability, that is, potential producing ability of the charge pump circuit depends on the frequency of the clock signal φ. Thus, this embodiment proposes an internal timer which can raise the frequency of the clock signal φ when the potential producing ability of the charge pump circuit must be made higher, and lower the frequency of the clock signal φ when the potential producing ability of the charge pump circuit must be made lower.

Figure 19:
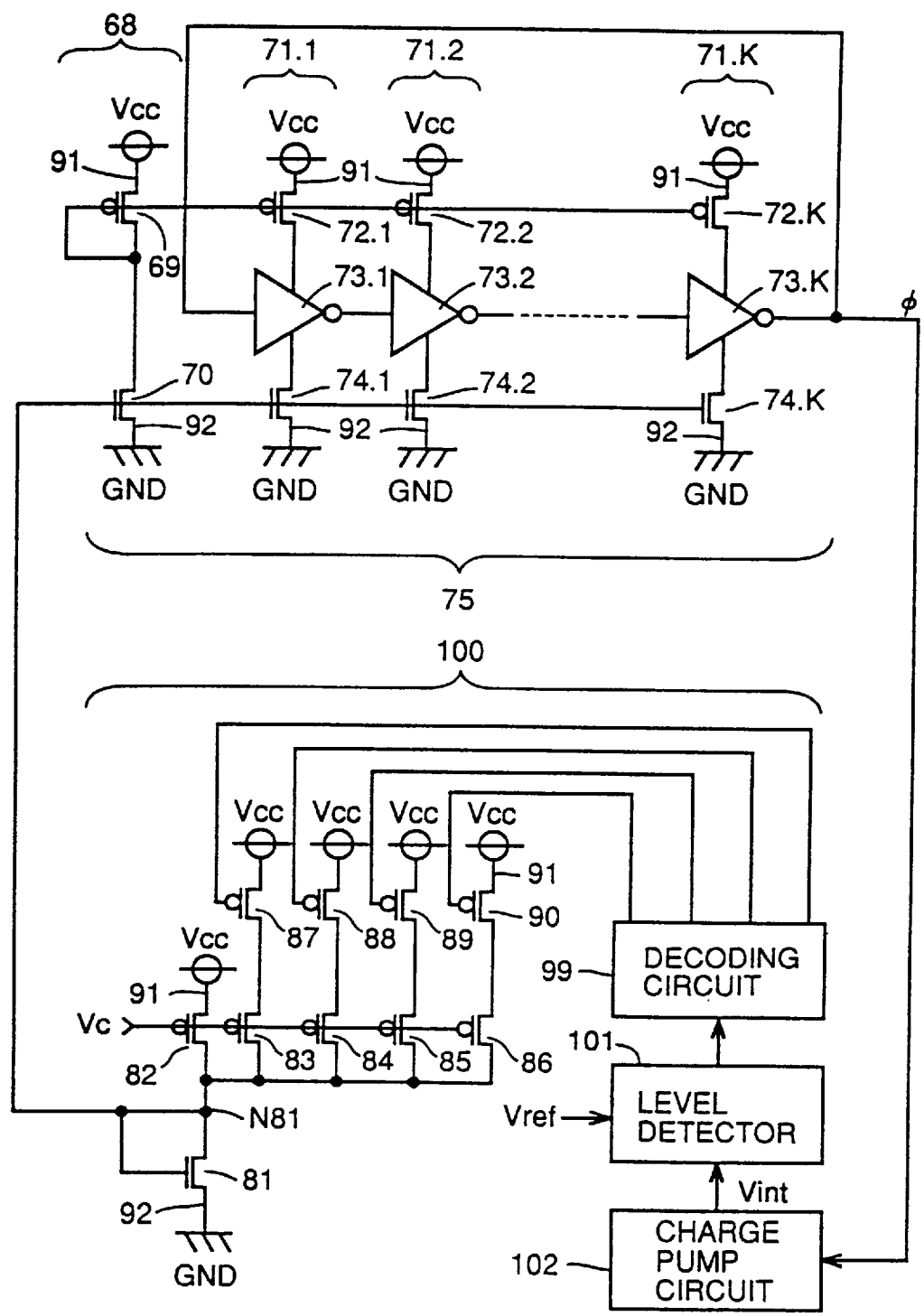
FIG. 19 is a partially omitted circuit block diagram showing a structure of an internal timer of a DRAM chip according to Embodiment 6 of the present invention.

FIG. 19 is a partially omitted circuit block diagram showing a structure of an internal timer of a DRAM chip according to Embodiment 6 of the present invention. Referring to FIG. 19, this internal timer includes a voltage controlled oscillator 75 and a current control portion 100. This current control portion 100 differs from current control portion 97 of FIG. 17 in that it is provided with a level detector 101 instead of control circuit 98.

Level detector 101 compares an internal potential Vint ($V_{BB}$, Vpp) produced by charge pump circuit 102 with a predetermined target potential Vref, and outputs a signal corresponding to the difference between them. This signal may be either an analog signal (voltage signal or current signal) of a value corresponding to the difference between internal potential Vint and target potential Vref or a digital signal indicating the difference between them. Decoding circuit 99 sets each of the P channel MOS transistors 87 to 90 at a conductive or non-conductive state according to the output signal of level detector 101.

The operation of this internal timer will be described next. When internal potential Vint produced by charge pump circuit 102 does not reach the target potential Vref and is largely offset from target potential Vref, level detector 101 and decoding circuit 99 renders all of P channel MOS transistors 80 to 90 conductive such that a large current 5Ic flows to N channel MOS transistor 81, raising the frequency of clock signal φ and making the potential producing ability of charge pump circuit 102 higher. As internal potential Vint approaches target potential Vref, level detector 101 and decoding circuit 99 reduces the number of the conductive P channel MOS transistors to lower the frequency of clock signal φ so that potential producing ability of charge pump circuit 102 is made lower. When internal potential Vint reaches target potential Vref, level detector 101 and decoding circuit 99 render P channel MOS transistor 82 conductive and stabilize internal potential Vint.

In this embodiment, since frequency of clock signal φ is controlled according to the difference between internal potential Vint and target potential Vref, internal potential Vint can approach target potential Vref rapidly when the difference between them is large, and overshooting of internal potential Vint can be suppressed to a minimum value when the difference between them is small. Accordingly, internal potential Vint would be stabilized.

[Embodiment 7]

In a DRAM, the leakage current of a memory cell and period in which refresh of data is required are varied from chip to chip. Thus, measurement is performed for the period of each chip in which refresh of data is required, and depending on the measured results, each chip is classified into 64 ms product, 124 ms product or 256 ms product, as shown in Table 1.

TABLE 1

| REFRESH STANDARD | REFRESH PERIOD (m sec) | REFRESH CYCLE (μ sec) |
| --- | --- | --- |
| 4K REFRESH | 64 | 16 |
|  | 128 | 32 |
|  | 256 | 64 |
| 8K REFRESH | 64 | 8 |
|  | 128 | 16 |
|  | 256 | 32 |

As used herein, a 64 ms product refers to a chip in which refresh of data for all memory cells is required once in 64 ms. A 124 ms product refers to a chip which requires refresh of data for all memory cells once in 124 ms. A 256 ms product refers to a chip which requires refresh of data for all memory cells once in 256 ms.

In addition, each of the DRAM chips is set at 4K refresh mode or 8K refresh mode, depending on the needs of the user. 4K refresh mode refers to a mode in which refresh of data is performed for all memory cells with 4K refresh operations. 8K refresh mode refers to a mode in which refresh of data is performed for all memory cells with 8K refresh operations.

In 64 ms product, 124 ms product and 256 ms product set at 4K refresh mode, a refresh cycle time in which one refresh operation is performed would be 16 μs, 32 μs and 64 μs, respectively. Also, in 64 ms product, 124 ms product and 256 ms product set at 8K refresh mode, the refresh cycle time would be 8 μs, 16 μs and 32 μs is, respectively.

Thus, in this embodiment, a proposal is made for an internal timer in which four types of clock signals, that is, clock signals having periods of 8 μs, 16 μs, 32 μs and 64 μs, respectively, can be obtained with one oscillator 75.

Figure 20:
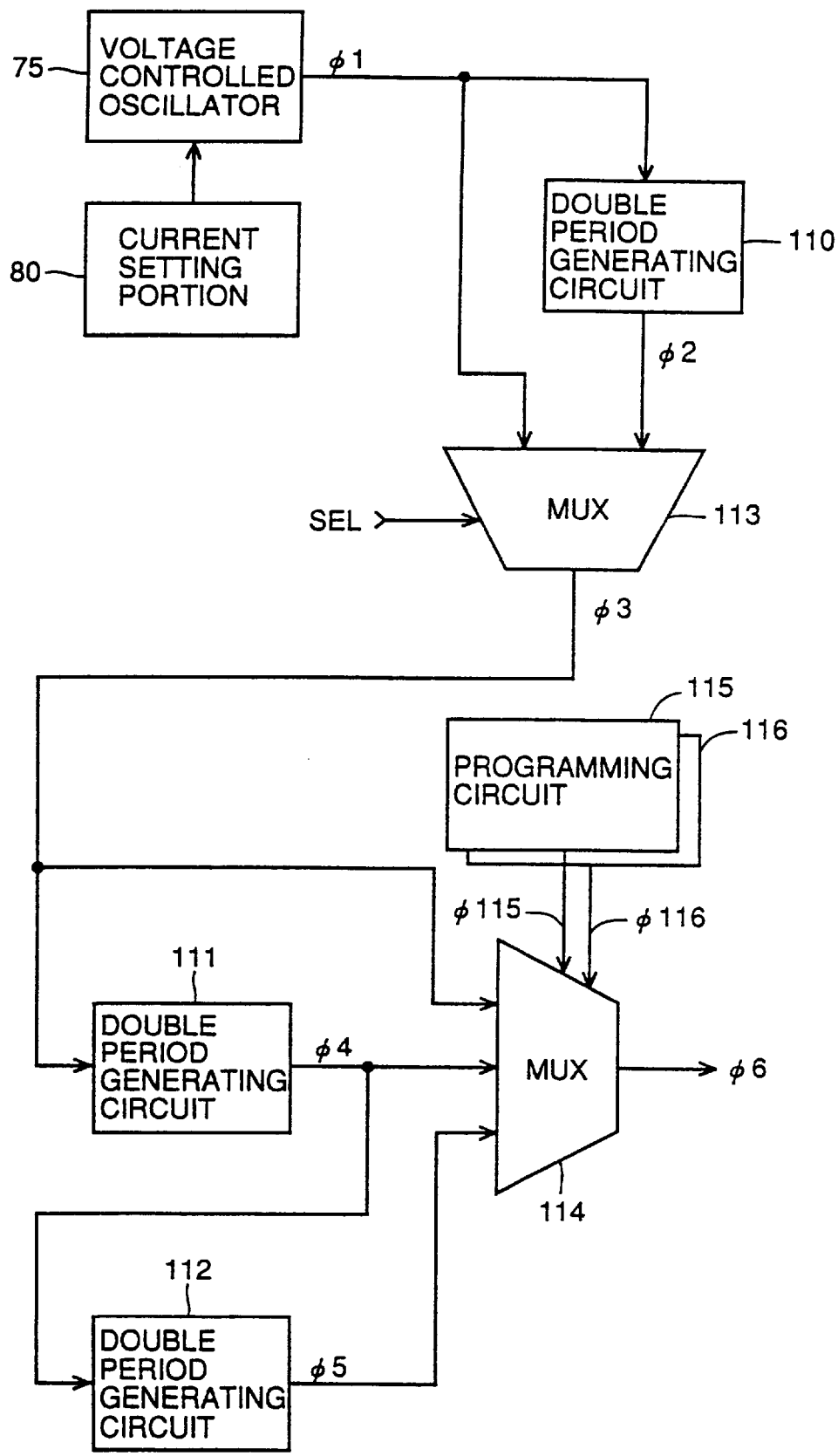
FIG. 20 is a circuit block diagram showing a structure of an internal timer of a DRAM chip according to Embodiment 7 of the present invention.

FIG. 20 is a circuit block diagram showing a structure of an internal timer of a DRAM chip according to Embodiment 7 of the present invention. Referring to FIG. 20, this internal timer includes a voltage controlled oscillator 75, a current setting portion 80, double period generating circuits 110 to 112, multiplexers (MUXs) 113, 114 and programming circuits 115, 116. Each of double period generating circuits 110 to 112 is formed by a static counter or a dynamic counter, for example.

Voltage controlled oscillator 75 and current setting portion 80 are identical to those described with reference to FIG. 15, and thus description thereof will not be provided here. They generate a clock signal $\phi1$ having a period of 8 μs, which would be a reference clock signal.

Double period generating circuit 110 converts clock signal $\phi1$ from voltage controlled oscillator 75 to a clock signal $\phi2$ having a period (16 μs) which is twice as long as the period (8 μs) of clock signal $\phi1$. Clock signals $\phi1$ and $\phi2$ are input to multiplexer 113. Multiplexer 113 passes one of clock signals $\phi1$ and $\phi2$ according to a select signal SEL.

Figure 21:
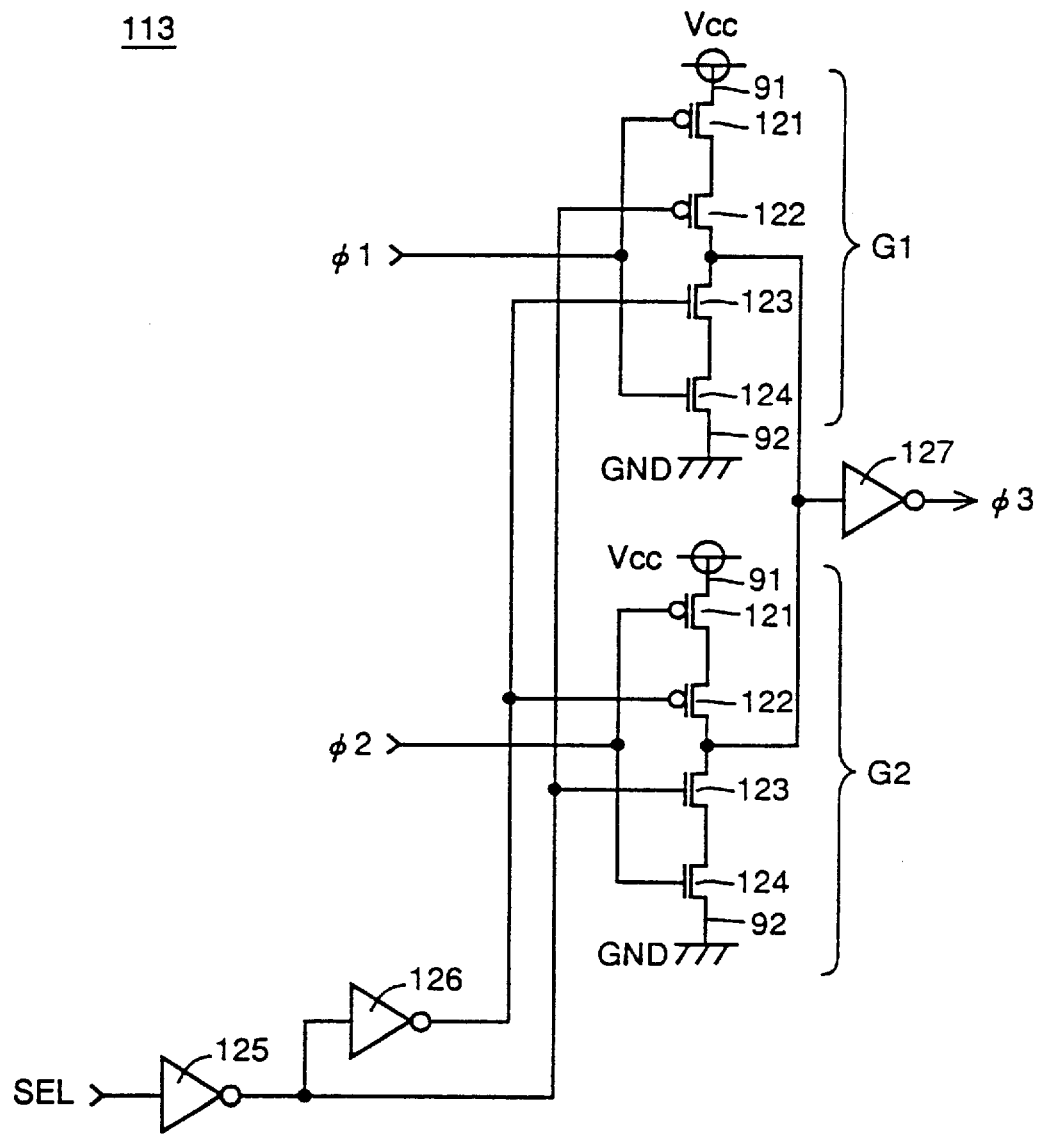
FIG. 21 is a circuit diagram showing a structure of a multiplexer 113 shown in FIG. 20.

More particularly, as shown in FIG. 21, multiplexer 113 is provided with two gate circuits G1 and G2 as well as inverters 125 to 127. Gate circuits G1 and G2 each include P channel MOS transistors 121, 122 and N channel MOS transistors 123, 124 which are connected in series between a power supply line 91 and a ground line 92.

Clock signal $\phi1$ is input to the gates of MOS transistors 121, 124 in gate circuit G1. Clock signal $\phi2$ is input to the gates of MOS transistors 121, 124 in gate circuit G2. Select signal SEL is input to the gate of P channel MOS transistor 122 in gate circuit G1 through inverter 125 as well as to the gate of N channel MOS transistor 123 in gate circuit G1 through inverters 125, 126. In addition, select signal SEL is input to the gate of N channel MOS transistor 123 in gate circuit G2 through inverter 125 as well as to the gate of P channel MOS transistor 122 in gate circuit G2 through inverters 125, 126. Outputs of gate circuits G1 and G2 are input to inverter 127. Output of inverter 127 becomes an output signal $\phi3$ from multiplexer 113.

When the chip is set at 4K refresh mode, select signal SEL is set at "H" level, and MOS transistors 122, 123 of gate circuit G1 are rendered conductive while MOS transistors 122, 123 of gate circuit G2 are rendered non-conductive. This causes activation of an inverter formed by MOS transistors 121, 124 of gate circuit G1, and clock signal $\phi1$ is output through gate circuit G1 and inverter 127.

Also, when the chip is set at 8K refresh mode, select signal SEL is set at "L" level, and MOS transistors 122, 123 of gate circuit G1 are rendered non-conductive while MOS transistors 122, 123 of gate circuit G2 are rendered conductive. This causes activation of an inverter formed by MOS transistors 121, 124 of gate circuit G2, and clock signal $\phi2$ is output through gate circuit G2 and inverter 127.

In other words, when the chip is set at 4K refresh mode, clock signal $\phi1$ would become clock signal $\phi3$, and when the chip is set at 8K refresh mode, clock signal $\phi2$ would become clock signal $\phi3$. Clock signal $\phi3$ is input to double period generating circuit 111 and multiplexer 114.

Double period generating circuit 111 converts clock signal $\phi3$ from multiplexer 113 into a clock signal $\phi4$ having a period (16 μs or 32 μs) which is twice as long as the period (8 μs or 16 μs) of clock signal $\phi3$. Clock signal $\phi4$ is input to double period generating circuit 112 and multiplexer 114.

Double period generating circuit 112 converts clock signal $\phi4$ from double period generating circuit 111 into a clock signal $\phi5$ having a period (32 μs or 64 μs) which is twice as long as the period (16 μs or 32 μs) of clock signal $\phi4$. Clock signal $\phi5$ is input to multiplexer 114.

More particularly, when the chip is set at 4K refresh mode, clock signals $\phi3$, $\phi4$ and $\phi5$ having periods of 8 μs, 16 μs and 32 μs, respectively, are input to multiplexer 114, and when the chip is set at 8K refresh mode, clock signals $\phi3$, $\phi4$, and $\phi5$ having periods of 16 μs, 32 μs and 64 μs, respectively, are input to multiplexer 114.

Multiplexer 114 passes only one of clock signals $\phi3$, $\phi4$, $\phi5$ according to output signals $\phi115$, $\phi116$ from programming circuits 115, 116.

Figure 22:
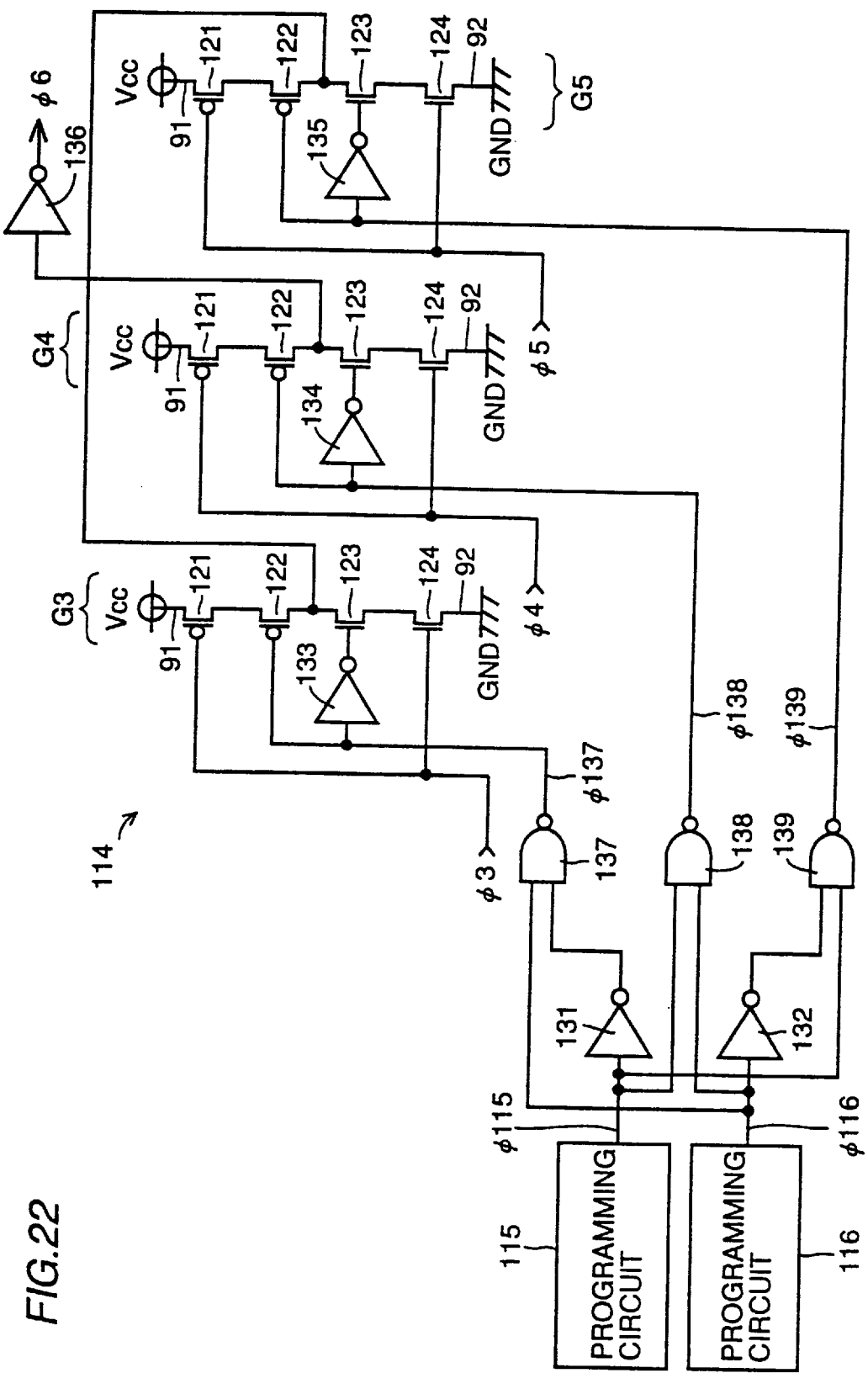
FIG. 22 is a circuit block diagram showing a structure of a multiplexer 114 shown in FIG. 20.

More particularly, as shown in FIG. 22, multiplexer 114 is provided with three gate circuits G3, G4 and G5, inverters 131 to 136 as well as NAND gates 137 to 139. Gate circuits G3, G4, G5 each include P channel MOS transistors 121, 122 and N channel MOS transistors 123, 124 connected in series between a power supply line 91 and a ground line 92.

Clock signal $\phi3$ is input to the gates of MOS transistors 121 and 124 in gate circuit G3. Clock signal $\phi4$ is input to the gates of MOS transistors 121 and 124 in gate circuit G4. Clock signal $\phi5$ is input to the gates of MOS transistors 121, 124 in gate circuit G5.

Output signal $\phi115$ of programming circuit 115 is input to one input node of NAND gate 137 via an inverter 131 while being input directly to one input nodes of NAND gates 138, 139. Output signal $\phi116$ from programming circuit 116 is input to the other input node of NAND gate 139 via an inverter 132 while being input directly to the other input nodes of NAND gates 137, 138.

An output signal $\phi137$ from NAND gate 137 is input to the gate of N channel MOS transistor 123 in gate circuit G3 by an inverter 133 while being input directly to P channel MOS transistor 122 of gate circuit G3. An output signal $\phi138$ from NAND gate 138 is input to the gate of N channel MOS transistor 123 in gate circuit G4 via an inverter 134 while being input directly to P channel MOS transistor 122 in gate circuit G4. An output signal $\phi139$ from NAND gate 139 is input to the gate of N channel MOS transistor 123 in gate circuit G5 via an inverter 135 while being input directly to P channel MOS transistor 122 of gate circuit G5. Outputs of gate circuits G3, G4, G5 are input to inverter 136. Output of inverter 136 would become an output signal $\phi6$ of multiplexer 114. Programming circuits 115, 116 are identical to programming circuit 93 shown in FIG. 6.

When the refresh period of the chip is 64 μs, fuse 43 of programming circuit 115 is disconnected to set output signal $\phi115$ of programming circuit 115 at "L" level and fuse 43 of programming circuit 116 is not disconnected such that output signal $\phi116$ of programming circuit 116 would be set at "H" level. Thus, only output signal $\phi137$ among output signals $\phi137$ to $\phi139$ of NAND gates 137 to 139 attains "L" level, MOS transistors 122, 123 of gate circuit G3 are rendered conductive, and inverter formed by MOS transistors 121, 124 of gate circuit G3 is activated. Accordingly, clock signal $\phi3$ is output through gate circuit G3 and inverter 136.

In addition, when the refresh period of the chip is 128 μs, fuse 43 of programming circuits 115, 116 are not disconnected so that output signals $\phi115$, $\phi116$ of programming circuits 115, 116 are both set at "H" level. Thus, only output signal $\phi138$ among output signals $\phi137$ to $\phi139$ of NAND gates 137 to 139 attains "L" level, MOS transistor 122, 123 of gate circuit G4 are rendered conductive, and the inverter formed by MOS transistors 121, 124 of gate circuit G4 is activated. Accordingly, clock signal $\phi4$ is output through gate circuit G4 and inverter 136.

When the refresh period of the chip is 256 μs, fuse 43 of programming circuit 116 is disconnected so that output signal φ116 of programming circuit 116 is set at "L" level, and fuse φ3 of programming circuit 115 is not disconnected such that output signal φ115 of programming circuit 115 is set at "H" level. Thus, only output signal φ139 among output signals φ137 to φ139 of NAND gates 137 to 139 attains "L" level, MOS transistors 122, 123 of gate circuit G5 are rendered conductive, and the inverter formed by MOS transistors 121, 124 of gate circuit G5 is activated. Accordingly, clock signal φ5 is output through gate circuit G5 and inverter 136.

In other words, clock signal φ3 becomes clock signal 46 when the chip is a 64 ms product, clock signal φ4 becomes clock signal φ6 when the chip is a 128 ms product, and clock signal φ5 becomes clock signal φ6 when the chip is a 256 ms product.

The reason for controlling multiplexer 113 by select signal SEL while controlling multiplexer 114 by output signals φ115, φ116 of programming circuits 115, 116 is as follows. Since the refresh period of the chip is determined by the charge holding ability of the memory cell, refresh period may be programmed in a fixed manner. This programming is performed when, for example, a defective memory cell is to be remedied. Meanwhile, determination on whether to set the chip at 4K refresh mode or 8K refresh mode is done at the time before shipping or at the time of assembly. Accordingly, it is difficult to perform a programming in a fixed manner for the refresh mode, and thus it is set by select signal SEL.

Description is now made for the way the internal timer would be used. First, the period of clock signal φ1 output from voltage controlled oscillator 75 is set accurately at 8 μs by current setting portion 80. Next, programming is performed on programming circuit 115, 116 according to the refresh period of the chip, and one of clock signals φ3, φ4 and φ5 is selected. When the refresh mode is determined, selector signal SEL is set at "H" or "L" level, to select one of the clock signals φ1 and φ2. The above setting determines the period of clock signal φ6.

In this embodiment, an effect similar to that of Embodiment 4 is obtained. Although it was possible to perform a tuning of oscillation period of oscillator 75 at a range 0.5 to 1.5 times as wide as the inherent oscillation cycle of oscillator 75 in Embodiment 4, it is possible to perform a tuning of oscillation period of oscillator 75 at a wider range of 0.5 to 12 times the inherent oscillation period of oscillator 75 in this embodiment.

[Embodiment 8]

In Embodiments 1 to 7, DRAM chips in which oscillation frequency of built-in oscillator can be changed and set have been implemented. In the embodiment described below, a frequency measuring apparatus for measuring the frequency of clock signal φ output from DRAM chip shown in Embodiments 1 to 7 is implemented.

Specification of the performance requirements is as follows.

Minimum resolution of the measured period: 0.1 μs or lower (1% or lower of the wanted period)

Range of the measured period (frequency): 1 μs–20 μs (50 kHz–500 kHz)

Figure 23:
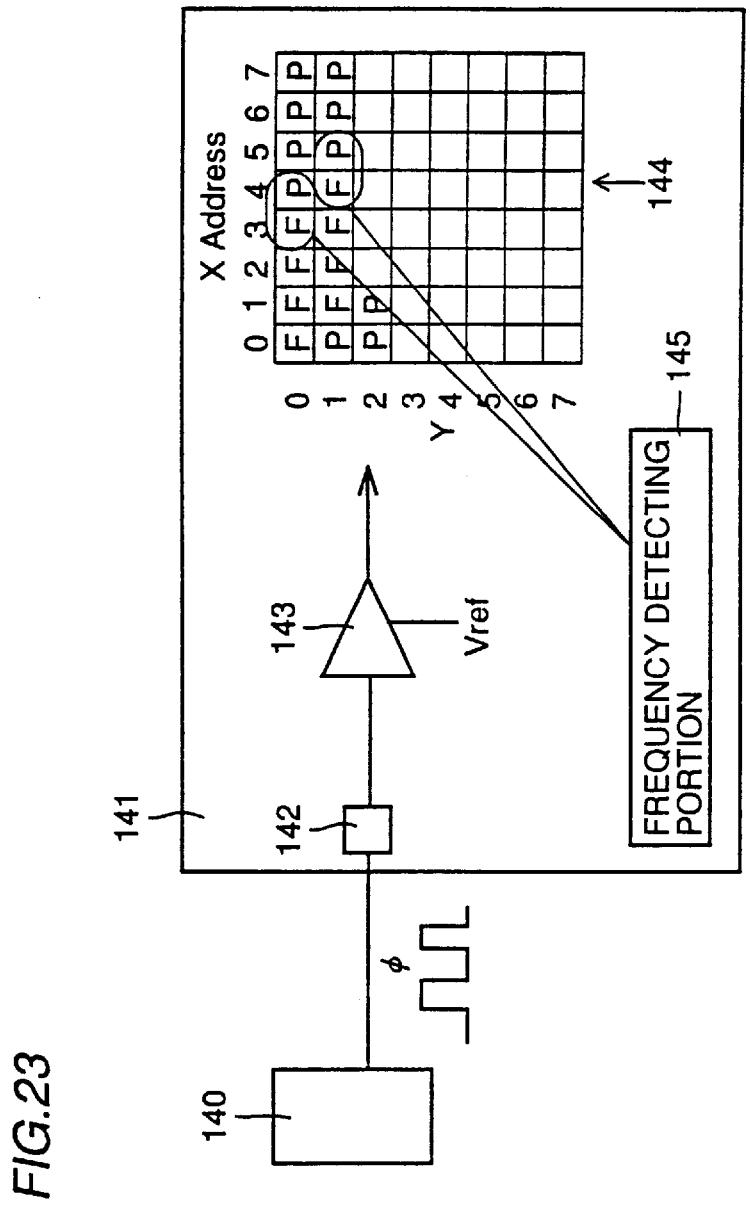
FIG. 23 is a block diagram showing a structure of a frequency measuring apparatus according to Embodiment 8 of the present invention.
Figure 24:
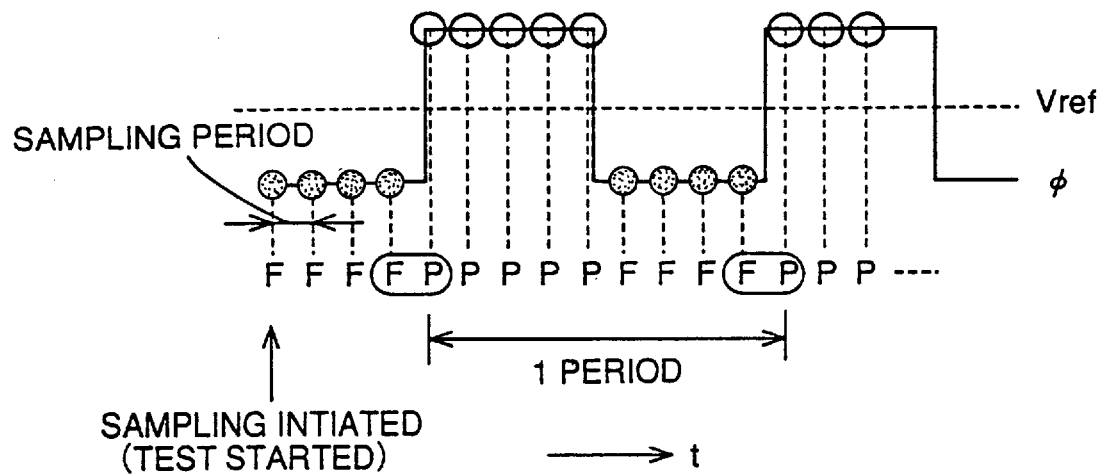
FIG. 24 illustrates the operation of the frequency measuring apparatus shown in FIG. 23.

FIG. 23 is a block diagram showing a structure of a frequency measuring apparatus 141 according to Embodiment 8 of the present invention. Referring to FIG. 23, this frequency measuring apparatus 141 includes a signal input terminal 142, a comparator 143, a memory portion 144 and a frequency detecting portion 145.

Signal input terminal 142 is supplied with clock signal φ of DRAM chip 140. Comparator 143 has a prescribed reference level Vref, and outputs "H" level in response to the level of clock signal φ input through signal input terminal 142 being higher than reference level Vref while outputting "L" level in response to the level of the clock signal φ being lower than reference level Vref. Here, comparator 143 should output "H" level and "L" level alternatingly with the duration of same time period for each level.

Memory portion 144 incorporates and stores the output of comparator 143 with a constant period which is sufficiently shorter than the period of clock signal φ. At this time, memory portion 144 stores "P(Pass)" if the output of comparator 143 is at "H" level, and "F(Fail)" if the output of comparator 143 is at "L" level. In addition, memory portion 144 increments the address for storing the results of sampling by sampling the output of comparator 143 once.

Frequency detecting portion 145 successively reads out the results of sampling stored in memory portion 144 to detect the changing point where the result of the reading changes from "F" to "P." Then, frequency detecting portion 145 counts the number of times of sampling between two changing points to perform an operation of (counted number)×(sampling period) so as to obtain the period [=1/(frequency)] of clock signal φ.

In this embodiment, the period of clock signal φ output from the DRAM chip can be detected automatically and easily.

[Embodiment 9]

Figure 25:
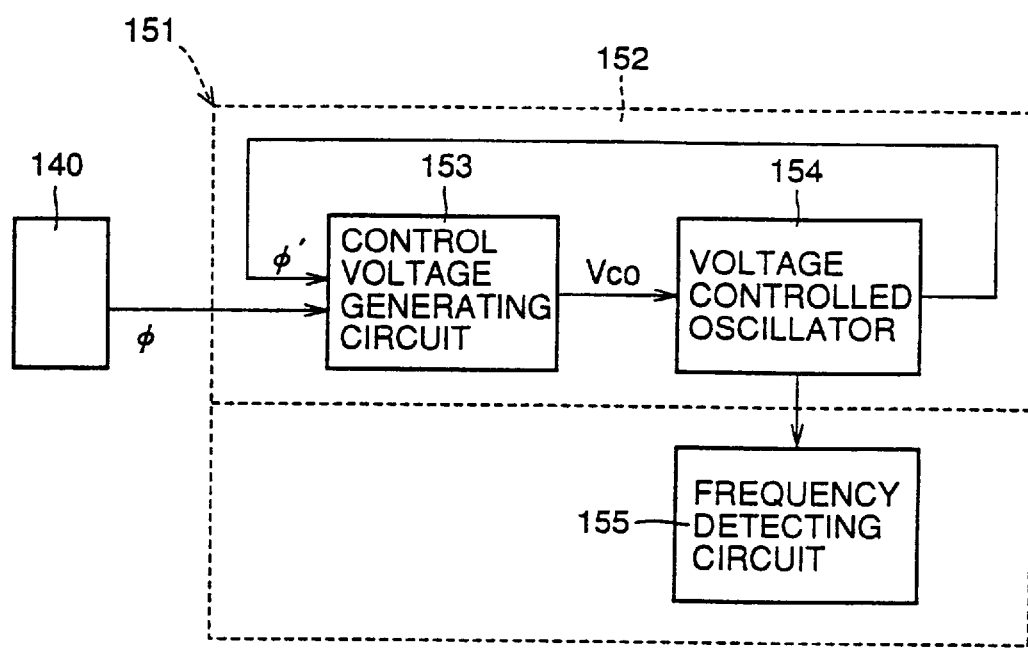
FIG. 25 is a block diagram showing a structure of a frequency measuring apparatus according to Embodiment 9 of the present invention.

FIG. 25 is a block diagram showing a structure of a frequency measuring apparatus 151 according to Embodiment 9 of the present invention. Referring to FIG. 25, this frequency measuring apparatus 151 includes a PLL circuit 152 and a frequency detecting circuit 155. PLL circuit 152 includes a control voltage generating circuit 153 and a voltage controlled oscillator 154. Control voltage generating circuit 153 receives a clock signal φ output from a DRAM chip 140 and an internal clock signal φ' output from voltage controlled oscillator 154, and outputs a control voltage Vco corresponding to the phase difference between the two clock signals φ and φ'.

Figure 26:
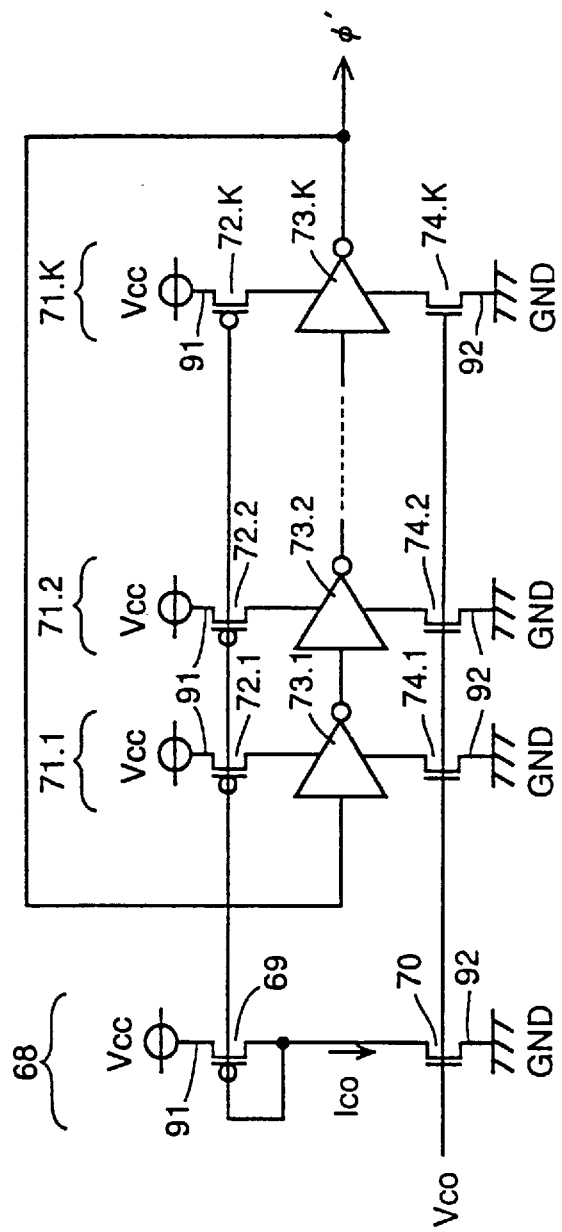
FIG. 26 is a partially omitted circuit diagram showing a structure of the voltage controlled oscillator in the frequency measuring apparatus shown in FIG. 25.

As shown in FIG. 26, voltage controlled oscillator 154 has a structure identical to that of voltage controlled oscillator 75 in FIG. 14 and receives control potential Vco output from control voltage generating circuit 153 at the gate of N channel MOS transistor 70 in bias generating circuit 68. Voltage controlled oscillator 154 oscillates at frequency corresponding to control potential Vco, and after being locked, oscillates at a frequency which is the same as that of clock signal φ of DRAM chip 140.

Frequency detecting circuit 155 stores the relationship between the oscillation frequency of voltage controlled oscillator 154 and control potential Vco (or current Ico flowing through bias generating circuit 68). Frequency detecting circuit 155 detects the control potential Vco (or current Ico) of voltage controlled oscillator 154 so as to obtain the oscillation frequency of voltage controlled oscillator 154, that is, the frequency of clock signal φ of DRAM chip, from the result of that detection.

In this embodiment, frequency of clock signal φ from DRAM chip can be detected easily with a structure which is more simple as compared to that of Embodiment 8.

[Embodiment 10]

Figure 27:
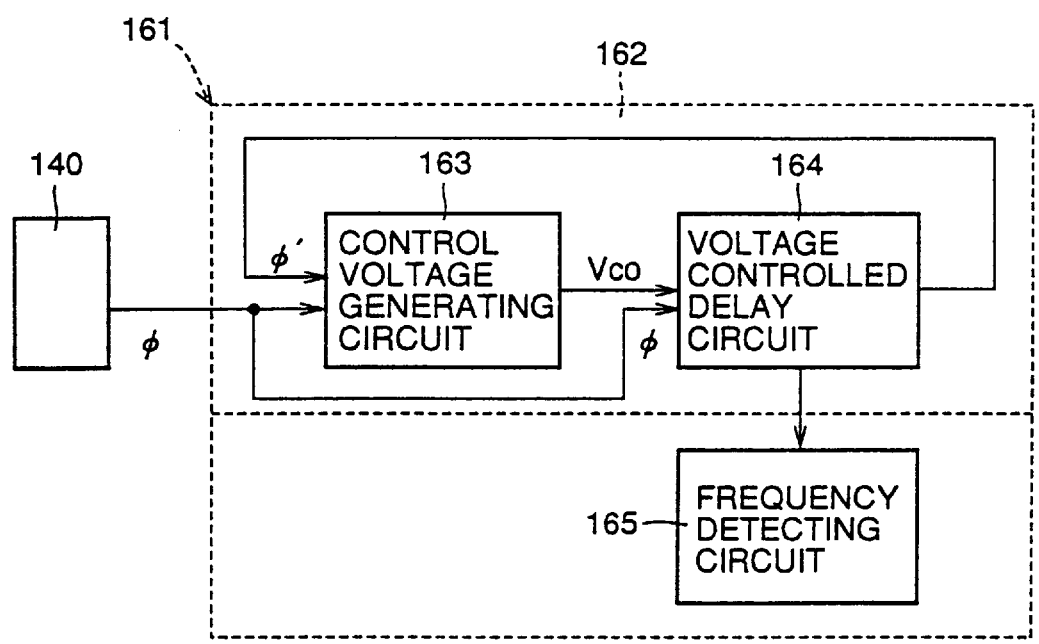
FIG. 27 is a block diagram showing a structure of a frequency measuring apparatus according to Embodiment 10 of the present invention.

FIG. 27 is a block diagram showing a structure of a frequency measuring apparatus 161 according to Embodiment 10 of the present invention. Referring to FIG. 27, this frequency measuring apparatus 165 includes a DLL circuit 162 and a frequency detecting circuit 165. DLL circuit 162 includes a control voltage generating circuit 163 and a voltage controlled delay circuit 164.

Controlled voltage generating circuit 163 receives a clock signal φ output from DRAM chip 140 and internal clock signal φ' output from voltage controlled delay circuit 164, and outputs a control potential Vco corresponding to the phase difference between the two clock signals φ and φ'.

Figure 28:
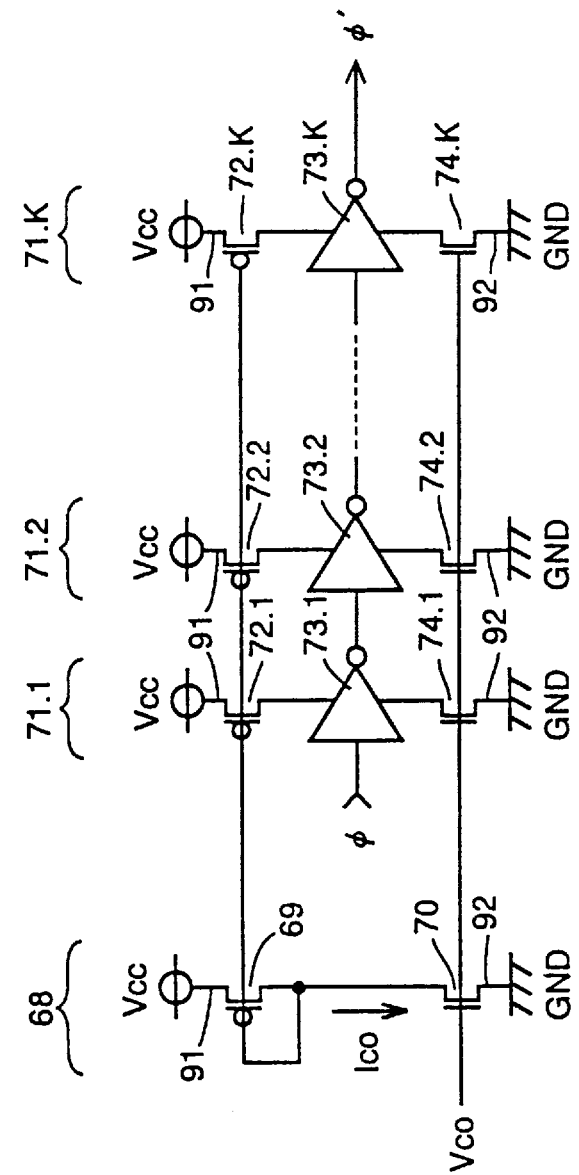
FIG. 28 is a partially omitted circuit diagram showing a structure of a voltage controlled delay circuit of the frequency measuring apparatus shown in FIG. 27.
Figure 29:
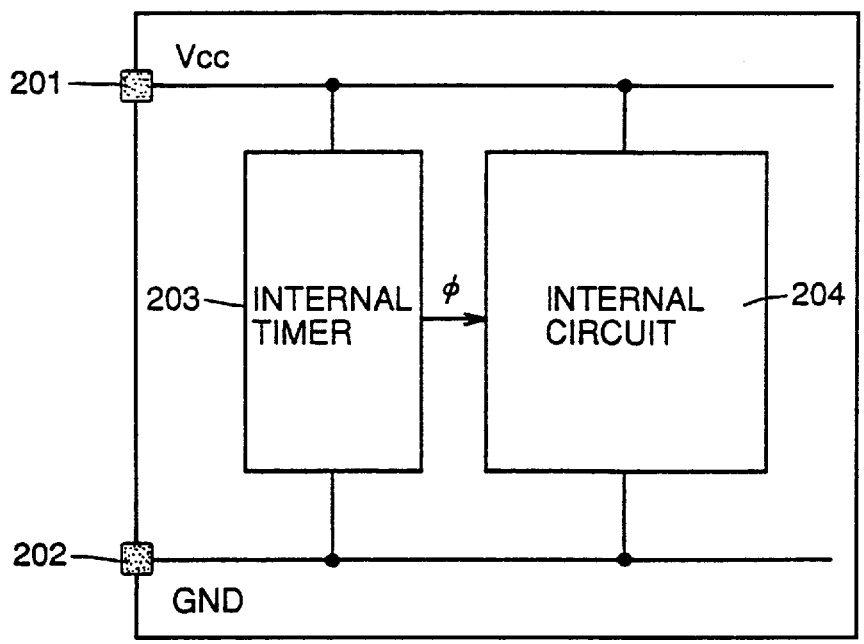
FIG. 29 is a block diagram showing a structure of a conventional DRAM chip.

As shown in FIG. 28, voltage controlled delay circuit 164 has a structure similar to that of voltage controlled oscillator 154 of FIG. 27 in which inverter 73.1 receives clock signal φ and inverter 73.K outputs internal clock signal φ'. After being locked, voltage controlled delay circuit 164 outputs internal clock signal φ' which is delayed by one period as compared to clock signal φ.

Frequency detecting circuit 165 stores the relationship between the delay time of voltage controlled delay circuit 164 and control potential Vco (or current Ico flowing through bias generating circuit 68). Frequency detecting circuit 165 detects control voltage Vco (or current Ico) of voltage controlled delay circuit 164 so as to obtain the delay time of voltage controlled delay circuit 164, that is, the period of clock signal φ from DRAM chip from the result of that detection.

An effect similar to that of Embodiment 9 is also obtained in this embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for performing a prescribed operation in synchronization with a clock signal, comprising, on a common chip:
   a clock generating circuit for generating said clock signal;
   an outputting terminal for drawing said clock signal output from said clock generating circuit externally of said chip; and
   switching means having one terminal for receiving said clock signal generated from said clock generating circuit and another terminal connected to said outputting terminal, wherein switching is activated in response to a control signal supplied externally of said chip.

2. A semiconductor device for performing a prescribed operation in synchronization with a clock signal, said semiconductor device comprising:
   an oscillator for producing the clock signal, the oscillator having a variable oscillation frequency; and
   a setting circuit capable of varying and setting the oscillation frequency of said oscillator, said setting circuit including a first portion for producing a binary address signal corresponding to a desired oscillation frequency, and a second portion for controlling said oscillator to operate at a frequency corresponding to said binary address signal.

3. The semiconductor device in accordance with claim 2, wherein said oscillator comprises:
   a plurality of inverters connected in a ring shape;
   a capacitance circuit provided corresponding to each inverter, connected to an output node of a corresponding inverter, said capacitance circuit having a variable capacitance value; and
   said setting circuit varies and sets the capacitance value of said capacitance circuit.

4. The semiconductor device in accordance with claim 3, wherein said oscillator further includes a transistor provided corresponding to each inverter and connected to at least one of a portion between a power supply node of the corresponding inverter and a power supply potential line and a portion between a ground node and a ground potential line, having its gate provided with an intermediate potential between a power supply potential and ground potential for suppressing a penetrating current of the corresponding inverter.

5. The semiconductor device in accordance with claim 3, wherein
   said capacitance circuit includes a plurality of sets of transfer gates and capacitors connected in series between an output node of the corresponding inverter and a prescribed potential line, and
   said setting means includes a fuse provided corresponding to each of the transfer gates for fixing a corresponding transfer gate at a conductive or non-conductive state.

6. The semiconductor device in accordance with claim 2, further comprising an output circuit externally drawing the clock signal from said oscillator.

7. The semiconductor device in accordance with claim 2, wherein
   said oscillator includes
   a plurality of inverters connected in a ring shape;
   a first transistor provided corresponding to each of the inverters, and connected between a power supply node of the corresponding inverter and a power supply potential line; and
   a second transistor provided corresponding to each of the inverters and connected between a ground node of the corresponding inverter and a ground potential line; and wherein
   said setting means changes and sets the input voltage of said first and second transistors.

8. The semiconductor device in accordance with claim 7, wherein
   said setting means includes
   a constant current source for causing a constant current to flow;
   a third transistor connected in series with said constant current source and forming a current mirror circuit with one of said first and second transistors;
   a plurality of fourth transistors connected in parallel with said third transistor, respectively, for dividing the flow of output current from said constant current source; and
   a fuse provided corresponding to each of the fourth transistors for fixing the corresponding fourth transistor at a conductive or non-conductive state.

9. The semiconductor device in accordance with claim 7, wherein
   said setting means includes
   a plurality of constant current sources for causing flow of constant current, respectively;
   a third transistor connected to an output node of each of said plurality of constant current sources for forming a current mirror circuit with one of said first and second transistors; and
   a fuse provided corresponding to each of the constant current sources for fixing the corresponding constant current source at an active or inactive state.

10. The semiconductor device in accordance with claim 2, further comprising:

a plurality of signal converting means connected in series in which said clock signal output from said oscillator is input to a first stage and each of said plurality of signal converting means converts the clock signal input from its preceding stage to a clock signal having a period which is a plurality of times the period of the input clock signal and outputs the converted signal to the following stage;

a selecting means for selecting one clock signal from said clock signal output from said oscillator and the plurality of clock signals output from said plurality of signal converting means; and an internal circuit for performing a prescribed operation in synchronization with the clock signal selected by said selecting means.

11. The semiconductor device in accordance with claim 10, wherein said selecting means includes a plurality of gate means provided corresponding to one of said oscillator and said plurality of signal converting means, respectively, to which the clock signal output from the corresponding oscillator or signal converting means is input; and a fuse provided corresponding to each of the gate means for fixing the corresponding gate means at a conductive or non-conductive state.

* * * * *